(12) United States Patent
Park et al.

(10) Patent No.: US 10,319,433 B2
(45) Date of Patent: Jun. 11, 2019

(54) MEMORY DEVICES AND METHODS OF OPERATING THE SAME

(71) Applicant: SAMSUNG ELECTRONICS CO., LTD., Suwon-si, Gyeonggi-Do (KR)

(72) Inventors: Sung-Hyun Park, Hwaseong-si (KR); In-Hak Lee, Daegu (KR); Jae-Seung Choi, Hwaseong-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/915,660

(22) Filed: Mar. 8, 2018

(65) Prior Publication Data

US 2019/0066773 A1 Feb. 28, 2019

(30) Foreign Application Priority Data

Aug. 23, 2017 (KR) .......................... 10-2017-0106407

(51) Int. Cl.
*G11C 11/419* (2006.01)
*G11C 7/18* (2006.01)
*G11C 11/408* (2006.01)
*H01L 27/11* (2006.01)
*G11C 7/14* (2006.01)
*G11C 11/4097* (2006.01)

(52) U.S. Cl.
CPC .............. *G11C 11/419* (2013.01); *G11C 7/14* (2013.01); *G11C 7/18* (2013.01); *G11C 11/4085* (2013.01); *G11C 11/4097* (2013.01); *H01L 27/1104* (2013.01)

(58) Field of Classification Search
CPC .................................................. G11C 11/419
USPC .......................................................... 365/156
See application file for complete search history.

(56) References Cited

U.S. PATENT DOCUMENTS

| | | | |
|---|---|---|---|
| 7,319,606 B2* | 1/2008 | Miyamoto | G11C 11/005 365/145 |
| 8,659,958 B2* | 2/2014 | Wang | G11C 11/417 365/185.2 |
| 8,760,927 B2 | 6/2014 | Deng | |
| 8,908,421 B2 | 12/2014 | Liaw | |
| 8,921,179 B2 | 12/2014 | Paul et al. | |
| 9,030,863 B2 | 5/2015 | Gulati et al. | |
| 9,064,561 B2* | 6/2015 | Hold | G11C 11/412 |
| 9,070,432 B2 | 6/2015 | Hsieh et al. | |
| 9,640,249 B2 | 5/2017 | Chen et al. | |
| 9,940,998 B2* | 4/2018 | Jung | G11C 7/12 |
| 2015/0029785 A1 | 1/2015 | Liaw | |
| 2015/0146476 A1 | 5/2015 | Zhang et al. | |

(Continued)

*Primary Examiner* — Son L Mai
(74) *Attorney, Agent, or Firm* — F. Chau & Associates, LLC

(57) ABSTRACT

A memory device includes a memory cell, a word line connected to the memory cell, a bit line connected to the memory cell, a complementary bit line connected to the memory cell, an auxiliary bit line, an auxiliary complementary bit line, and a switch circuit. The memory cell stores a single bit. The switch circuit electrically connects one of the bit line and the complementary bit line to one of the auxiliary bit line and the auxiliary complementary bit line, in response to a logic level of a data bit to be written in the memory cell during a write operation, by using at least one or more transistors of at least one dummy cell as a switch, and the at least one dummy cell does not store a data bit.

20 Claims, 17 Drawing Sheets

(56) References Cited

U.S. PATENT DOCUMENTS

2015/0206576 A1 7/2015 Goel et al.
2015/0235695 A1 8/2015 Chen et al.
2015/0380078 A1 12/2015 Liaw
2017/0032835 A1 2/2017 Liaw

* cited by examiner ized inventive concept, relate to a memory device, and more particularly, to a memory device and a method of operating the memory device.

MEMORY DEVICES AND METHODS OF OPERATING THE SAME

CROSS-REFERENCE TO RELATED APPLICATION(S)

This application claims priority under 35 U.S.C. § 119 to Korean Patent Application No. 10-2017-0106407, filed on Aug. 23, 2017 in the Korean Intellectual Property Office (KIPO), the disclosure of which is incorporated by reference herein in its entirety.

TECHNICAL FIELD

Exemplary embodiments of the inventive concept relate to a memory device, and more particularly, to a memory device and a method of operating the memory device.

DISCUSSION OF RELATED ART

Generally, a static random access memory (SRAM) device stores data in a latch circuit of a memory cell through a bit line and a complementary bit line during a write operation, and reads data stored in the latch circuit of the memory cell by sensing a voltage difference between the bit line and the complementary bit line, which is determined based on the data stored in the latch circuit of the memory cell, during a read operation.

In the SRAM device, a write assist operation may be performed to enhance write performance.

SUMMARY

According to an exemplary embodiment of the inventive concept, a memory device includes a memory cell, a word line connected to the memory cell, a bit line connected to the memory cell, a complementary bit line connected to the memory cell, an auxiliary bit line, an auxiliary complementary bit line, and a switch circuit. The memory cell stores a single bit. The switch circuit electrically connects one of the bit line and the complementary bit line to one of the auxiliary bit line and the auxiliary complementary bit line, in response to a logic level of a data bit to be written in the memory cell during a write operation, by using at least one or more transistors of at least one dummy cell as a switch, and the at least one dummy cell does not store a data bit.

According to an exemplary embodiment of the inventive concept, a memory device includes a memory cell array, a plurality of auxiliary bit lines, a plurality of auxiliary complementary bit lines, and a switch circuit. The memory cell array includes a plurality of memory cells connected to a plurality of word lines, a plurality of bit lines, and a plurality of complementary bit lines. The plurality of word lines extend in a first direction, the plurality of bit lines extend in a second direction crossing the first direction, and the plurality of complementary bit lines extend in the second direction. The plurality of auxiliary bit lines extend in the second direction. The plurality of auxiliary complementary bit lines extend in the second direction. The switch circuit electrically connects one of a corresponding one of the bit lines and a corresponding one of the complementary bit lines to one of a corresponding one of the auxiliary bit lines and a corresponding one of the auxiliary complementary bit lines, in response to a logic level of a data bit to be written through each of the bit lines and each of the complementary bit lines in the memory cells during a write operation, by using at least one or more transistors of each of dummy cells as a switch, and each of the dummy cells does not store a data bit.

According to an exemplary embodiment of the inventive concept, in a method of operating a memory device, the memory device includes a memory cell array including a plurality of memory cells connected to a plurality of word lines extending a first direction, a plurality of bit lines extending in a second direction crossing the first direction, and a plurality of complementary bit lines extending in the second direction. The plurality of bit lines and the plurality of complementary bit lines are precharged. A write command and data are received from an external memory controller. One of a corresponding one of the plurality of bit lines and a corresponding one of the plurality of complementary bit lines is electrically connected to one of a corresponding one of the plurality of auxiliary bit lines and a corresponding one of the plurality of auxiliary complementary bit lines, in response to a logic level of a data bit to be written through each of the plurality of bit lines and each of the plurality of complementary bit lines in the plurality of memory cells during a write operation, by using at least one or more transistors of each of dummy cells as a switch. Each of the dummy cells does not store a data bit. The data is stored in a corresponding memory cell of the plurality of memory cells.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
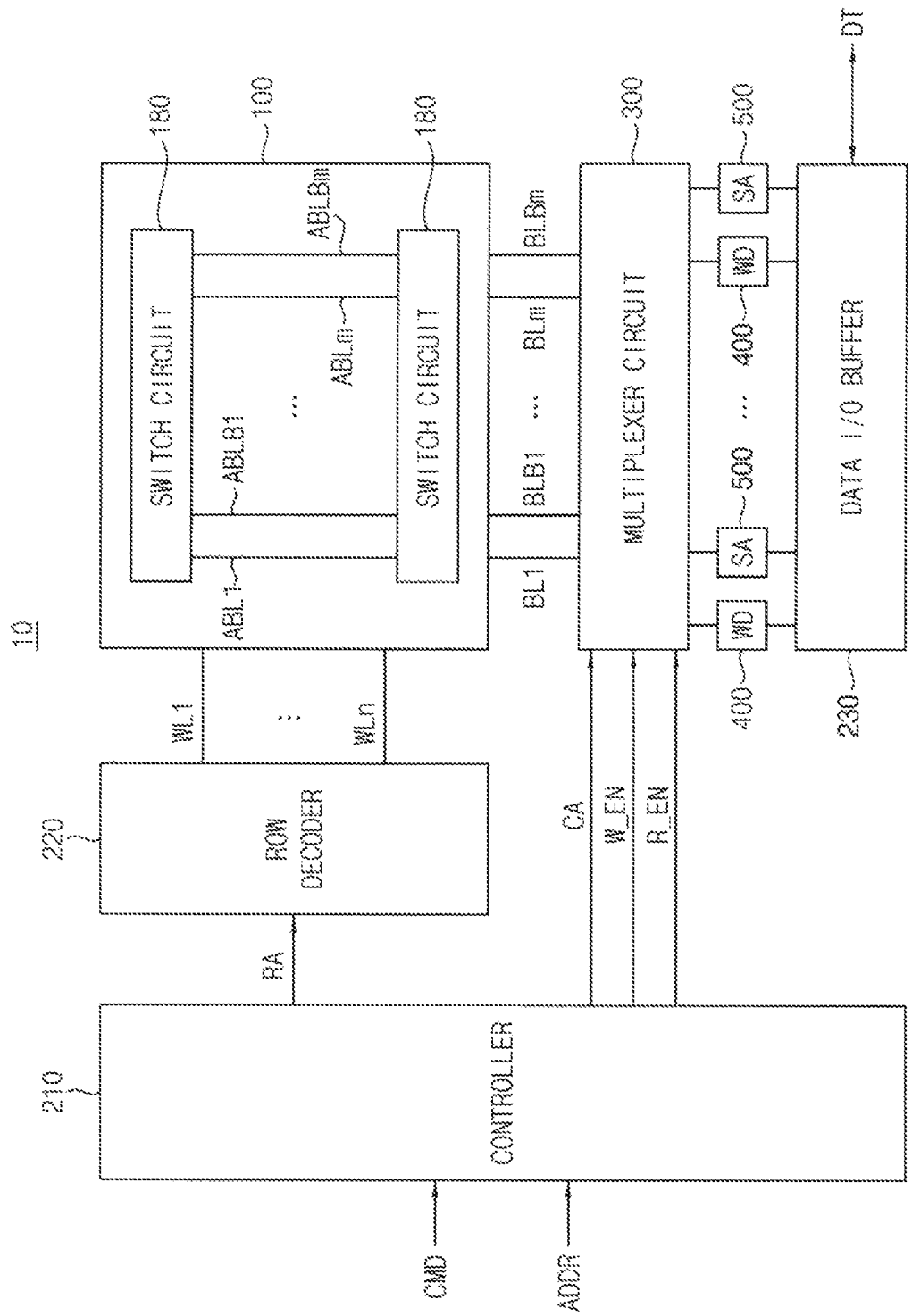
FIG. 1 is a block diagram illustrating a memory device according to an exemplary embodiment of the inventive concept.

Exemplary embodiments of the inventive concept provide a memory device capable of enhancing write performance without increasing an occupied area.

Exemplary embodiments of the inventive concept also provide a method of operating the above-described memory device.

Exemplary embodiments of the inventive concept will be described more fully hereinafter with reference to the accompanying drawings. Like reference numerals may refer to like elements throughout this application.

FIG. 1 is a block diagram illustrating a memory device according to an exemplary embodiment of the inventive concept.

Referring to FIG. 1, a memory device 10 includes a memory cell array 100, a controller 210, a row decoder 220, a multiplexer circuit 300, a plurality of write drivers 400, a plurality of sense amplifiers 500, and a data input/output (I/O) buffer 230.

In exemplary embodiments of the inventive concept, the memory device 10 may correspond to a static random access memory (SRAM) device.

The memory cell array 100 may include a plurality of memory cells arranged in rows and columns. The plurality of memory cells may be connected to first through n-th word lines WL1~WLn, first through m-th bit lines BL1~BLm, and first through m-th complementary bit lines BLB1~BLBm. Here, n and m represent positive integers. Each of the plurality of memory cells may correspond to a SRAM cell to store a single bit.

The controller 210 may control an operation of the memory device 10 based on a command signal CMD and an address signal ADDR received from an external device.

The controller 210 may generate a row address RA and a column address CA based on the address signal ADDR, provide the row address RA to the row decoder 220, and provide the column address CA to the multiplexer circuit 300. In addition, the controller 210 may generate a write enable signal W_EN and a read enable signal R_EN based on the command signal CMD, and provide the write enable signal W_EN and the read enable signal R_EN to the multiplexer circuit 300.

The row decoder 220 may be coupled to the memory cell array 100 through the first through n-th word lines WL1~WLn. The row decoder 220 may decode the row address RA provided from the controller 210 and select one of the plurality of rows included in the memory cell array 100 by activating one of the first through n-th word lines WL1~WLn corresponding to the row address RA. For example, the row decoder 220 may apply a word line driving voltage to a word line corresponding to the row address RA.

The multiplexer circuit 300 may be coupled to the memory cell array 100 through the first through m-th bit lines BL1~BLm and the first through m-th complementary bit lines BLB1~BLBm. The multiplexer circuit 300 may decode the column address CA provided from the controller 210 and select a bit line and a complementary bit line, among the first through m-th bit lines BL1~BLm and the first through m-th complementary bit lines BLB1~BLBm, corresponding to the column address CA.

In addition, when the write enable signal W_EN, which is provided from the controller 210, is activated, the multiplexer circuit 300 may couple the write driver 400 of a column corresponding to the column address CA to the selected bit line and the selected complementary bit line. In this case, the data I/O buffer 230 may provide data DT received from the external device to the write driver 400, and the write driver 400 may store the data DT in the memory cell array 100 through the selected bit line and the selected complementary bit line.

On the other hand, when the read enable signal R_EN, which is provided from the controller 210, is activated, the multiplexer circuit 300 may couple the sense amplifier 500 of a column corresponding to the column address CA to the selected bit line and the selected complementary bit line. In this case, the sense amplifier 500 may generate read data DT based on a voltage of the selected bit line and a voltage of the selected complementary bit line, and the data I/O buffer 230 may provide the data DT received from the sense amplifier 500 to the external device.

As illustrated in FIG. 1, the memory cell array 100 included in the memory device 10 may further include first through m-th auxiliary bit lines ABL1~ABLm, which are substantially parallel to the first through m-th bit lines BL1~BLm, and first through m-th auxiliary complementary bit lines ABLB1~ABLBm, which are substantially parallel to the first through m-th complementary bit lines BLB1~BLBm.

In addition, the memory cell array 100 included in the memory device 10 may further include a switch circuit 180 coupled between the first through m-th bit lines BL1~BLm and the first through m-th auxiliary bit lines ABL1~ABLm, and between the first through m-th complementary bit lines BLB1~BLBm and the first through m-th auxiliary complementary bit lines ABLB1~ABLBm.

During a write operation, the switch circuit 180, in response to a logic level of data to be written in the memory cell through a corresponding bit line and a corresponding complementary bit line, may connect one of a corresponding one of the first through m-th bit lines BL1~BLm and a corresponding one of the first through m-th complementary bit lines BLB1~BLBm to one of a corresponding one of the first through m-th auxiliary bit lines ABL1~ABLm and a corresponding one of the first through m-th auxiliary complementary bit lines ABLB1~ABLBm.

When one of the corresponding bit line and the corresponding complementary bit line is electrically connected to one of the corresponding auxiliary bit line and the corresponding auxiliary complementary bit line during the write operation, resistance of each of the corresponding bit line and the corresponding complementary bit line is substantially reduced, and thus a write performance of the memory device 10 may be enhanced.

Figure 2:
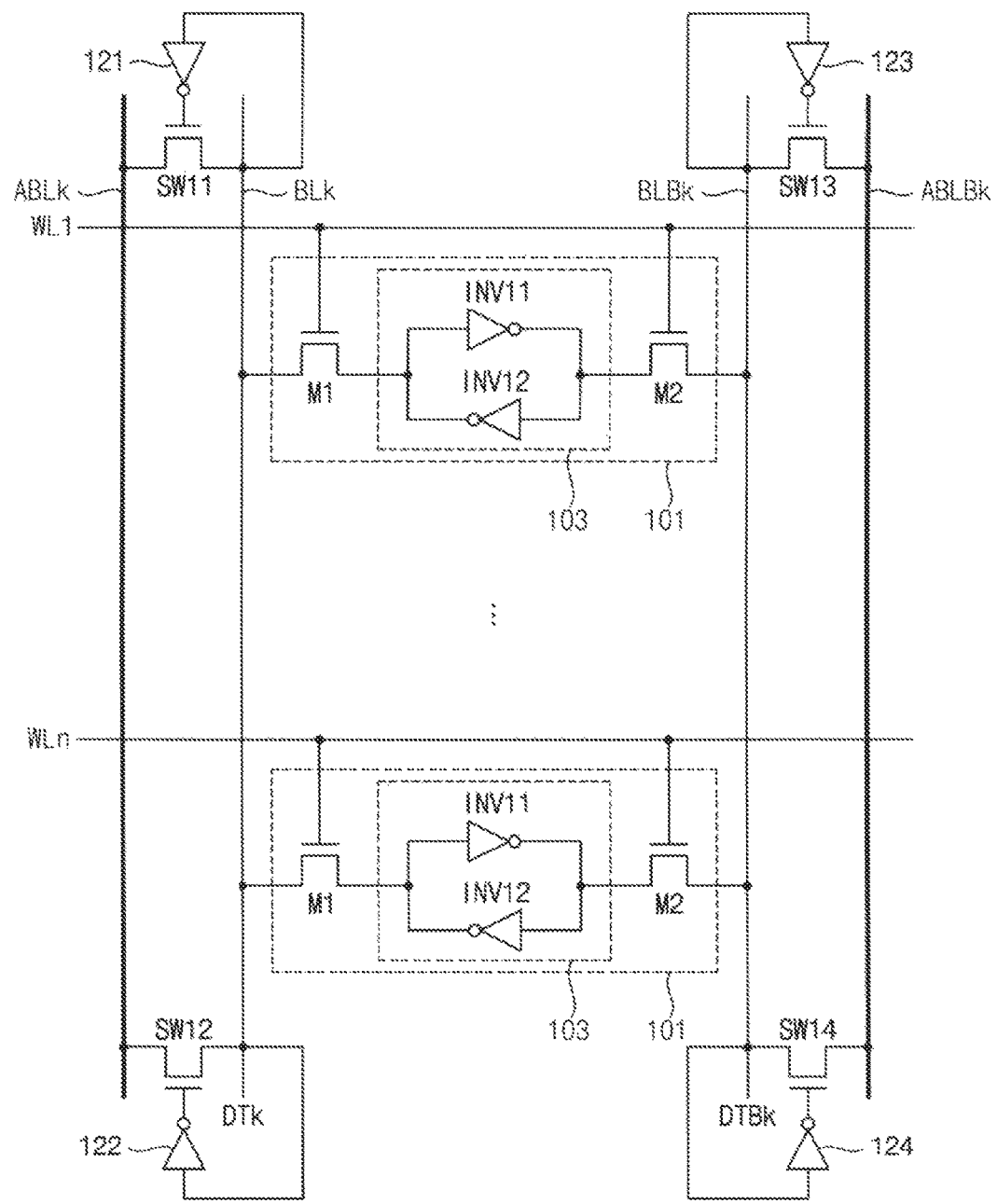
FIG. 2 is a circuit diagram illustrating a memory cell array included in the memory device of FIG. 1 according to an exemplary embodiment of the inventive concept.

FIG. 2 is a circuit diagram illustrating a memory cell array included in the memory device of FIG. 1 according to an exemplary embodiment of the inventive concept.

For ease of explanation, only memory cells included in a k-th column among first through m-th columns are illustrated in FIG. 2. Here, k represents a positive integer less than or equal to m.

Referring to FIG. 2, the k-th column of the memory cell array 100 may include first through n-th memory cells 101 coupled to the first through n-th word lines WL1~WLn, respectively.

Since structures of the plurality of memory cells 101 included in the memory cell array 100 are substantially the same, only a structure of the memory cell 101 coupled to the first word line WL1 in the k-th column will be described as an example.

The memory cell 101 may include a first transistor M1, a second transistor M2, and a data storage circuit 103.

The data storage circuit 103 may store a single bit. The data storage circuit 103 may include a first inverter INV11 and a second inverter INV12.

An output electrode of the first inverter INV11 may be coupled to an output electrode of the second inverter INV12, and an output electrode of the second inverter INV12 may be coupled to an output electrode of the first inverter INV11, such that the first inverter INV11 and the second inverter INV12 may form a latch circuit.

The first transistor M1 may be coupled between the k-th bit line BLk and the input electrode of the first inverter INV1. The first transistor M1 may include a gate coupled to the first word line WL1.

The second transistor M2 may be coupled between the k-th complementary bit line BLBk and the input electrode of the second inverter INV2. The second transistor M2 may include a gate coupled to the first word line WL1.

Each of the plurality of memory cells 101 included in the memory cell array 100 may have substantially the same structure as the structure of the memory cell 101 coupled to the first word line WL1 in the k-th column.

As described above, the memory cell array 100 may further include the switch circuit 180 coupled between the first through m-th bit lines BL1~BLm and the first through m-th auxiliary bit lines ABL1~ABLm, and between the first through m-th complementary bit lines BLB1~BLBm and the first through m-th auxiliary complementary bit lines ABLB1~ABLBm.

As illustrated in FIG. 2, the switch circuit 180 may include a plurality of first switches SW11, a plurality of second switches SW12, a plurality of third switches SW13, and a plurality of fourth switches SW14. Each of the first through m-th columns of the memory cell array 100 may include the first switch SW11, the second switch SW12, the third switch SW13, the fourth switch SW14, a first inverter 121, a second inverter 122, a third inverter 123, and a fourth inverter 124.

Referring to FIG. 2, the first inverter 121 may be coupled to a first end of the k-th bit line BLk. The first switch SW11 may be a first transistor which has a first electrode coupled to the first end of the k-th bit line BLk, a second electrode coupled to a first end of the k-th auxiliary bit line ABLk, and a gate coupled to an output terminal of the first inverter 121.

The second inverter 122 may be coupled to a second end of the k-th bit line BLk. The second switch SW12 may be a second transistor which has a first electrode coupled to the second end of the k-th bit line BLk, a second electrode coupled to a second end of the k-th auxiliary bit line ABLk, and a gate coupled to an output terminal of the second inverter 122.

The third inverter 123 may be coupled to a first end of the k-th complementary bit line BLBk. The third switch SW13 may be a third transistor which has a first electrode coupled to the first end of the k-th complementary bit line BLBk, a second electrode coupled to a first end of the k-th auxiliary complementary bit line ABLBk, and a gate coupled to an output terminal of the third inverter 123.

The fourth inverter 124 may be coupled to a second end of the k-th complementary bit line BLBk. The fourth switch SW14 may be a fourth transistor which has a first electrode coupled to the second end of the k-th complementary bit line BLBk, a second electrode coupled to a second end of the k-th auxiliary complementary bit line ABLBk, and a gate coupled to an output terminal of the fourth inverter 124.

In FIG. 2, each of the first through fourth switches SW11~SW14 may be an n-channel metal-oxide semiconductor (NMOS) transistor, a k-th data bit DTk may be provided through the k-th bit line BLk, and a k-th complementary data bit DTBk may be provided through the k-th complementary bit line BLBk.

Therefore, when the k-th data bit DTk has a low level, the k-th bit line BLk is electrically coupled to the k-th auxiliary bit line ABLk, and the k-th complementary bit line BLBk is electrically disconnected from the k-th auxiliary complementary bit line ABLBk. In addition, when the k-th data bit DTk has a high level, the k-th bit line BLk is electrically disconnected from the k-th auxiliary bit line ABLk, and the k-th complementary bit line BLBk is electrically connected to the k-th auxiliary complementary bit line ABLBk.

In the SRAM device, the k-th bit line BLk and the k-th complementary bit line BLBk are maintained at a high level in a standby mode, and a write operation is performed by one of the bit line BLk and the k-th complementary bit line BLBk, which transfers data having a low level. Therefore, in the SRAM device, data having the low level is dominant. Therefore, when one of the bit line and the complementary bit line, which transfers data having the low level, is electrically coupled to one of the auxiliary bit line and the auxiliary complementary bit line, the write performance is enhanced because resistance of the bit line or the complementary bit line is reduced.

In exemplary embodiments of the inventive concept, a width of each of the first through m-th auxiliary bit lines ABL1~ABLm may be greater than a width of each of the first through m-th bit lines BL1~BLm. In addition, a width of each of the first through m-th auxiliary complementary bit lines ABLB1~ABLBm may be greater than a width of each of the first through m-th complementary bit lines BLB1~BLBm. Further, the width of each of the first through m-th bit lines BL1~BLm may be substantially the same as the width of each of the first through m-th complementary bit lines BLB1~BLBm, and the width of each of the first through m-th auxiliary bit lines ABL1~ABLm may be substantially the same as the width of each of the first through m-th auxiliary complementary bit lines ABLB1~ABLBm.

Since the width of each of the first through m-th auxiliary bit lines ABL1~ABLm is greater than the width of each of the first through m-th bit lines BL1~BLm and the width of each of the first through m-th auxiliary complementary bit lines ABLB1~ABLBm is greater than the width of each of the first through m-th complementary bit lines BLB1~BLBm, a resistance of each of the first through m-th auxiliary bit lines ABL1~ABLm is smaller than a resistance of each of the first through m-th bit lines BL1~BLm and a resistance of each of the first through m-th auxiliary complementary bit lines ABLB1~ABLBm is smaller than a resistance of each of the first through m-th complementary bit lines BLB1~BLBm.

Generally, when a width of a metal line is relatively small, a resistance of the metal line is relatively large and a parasitic capacitance of the metal line is relatively small. On the other hand, when a width of a metal line is relatively large, a resistance of the metal line is relatively small and a parasitic capacitance of the metal line is relatively large.

As described above, the width of each of the first through m-th auxiliary bit lines ABL1~ABLm may be greater than the width of each of the first through m-th bit lines BL1~BLm, and the width of each of the first through m-th auxiliary complementary bit lines ABLB1~ABLBm may be greater than the width of each of the first through m-th complementary bit lines BLB1~BLBm. Therefore, a resistance of each of the first through m-th auxiliary bit lines ABL1~ABLm may be smaller than a resistance of each of the first through m-th bit lines BL1~BLm, and a parasitic capacitance of each of the first through m-th auxiliary bit lines ABL1~ABLm may be greater than a parasitic capacitance of each of the first through m-th bit lines BL1~BLm. In addition, a resistance of each of the first through m-th auxiliary complementary bit lines ABLB1~ABLBm may be smaller than a resistance of each of the first through m-th complementary bit lines BLB1~BLBm, and a parasitic capacitance of each of the first through m-th auxiliary complementary bit lines ABLB1~ABLBm may be greater than a parasitic capacitance of each of the first through m-th complementary bit lines BLB1~BLBm.

Figure 3:
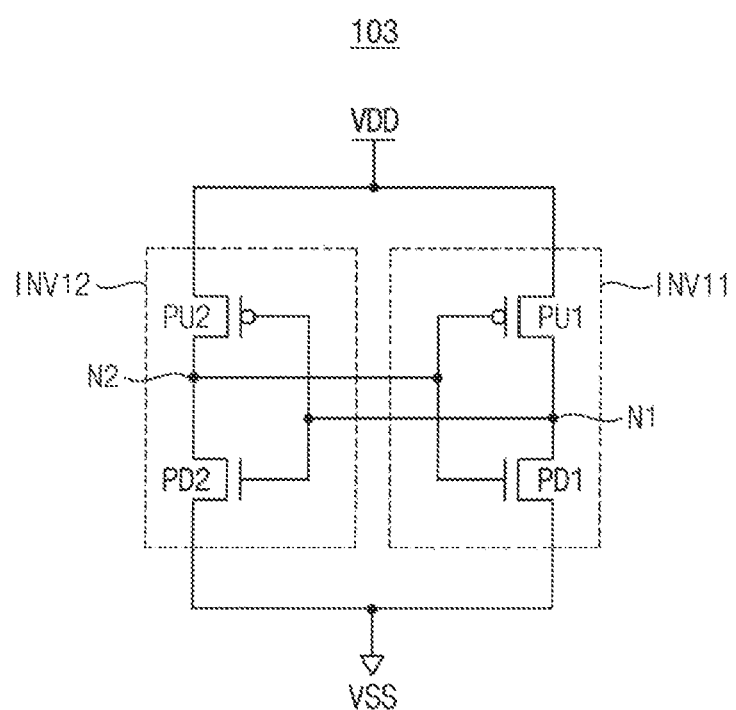
FIG. 3 is a circuit diagram illustrating a first inverter and a second inverter of a data storage circuit in a memory cell in the memory cell array of FIG. 2 according to an exemplary embodiment of the inventive concept.

FIG. 3 is a circuit diagram illustrating a first inverter and a second inverter of a data storage circuit in a memory cell in the memory cell array of FIG. 2 according to an exemplary embodiment of the inventive concept.

Referring to FIG. 3, the first inverter INV11 includes a first pull-up transistor PU1 and a first pull-down transistor PD1. The second inverter INV12 includes a second pull-up transistor PU2 and a second pull-down transistor PD2.

The first pull-up transistor PU1 may be a PMOS transistor that includes a source coupled to a power supply voltage VDD, a drain coupled to a first node N1, and a gate coupled to a second node N2. The first pull-down transistor PD1 may be an NMOS transistor that includes a drain coupled to the first node N1, a source coupled to a ground voltage VSS, and a gate coupled to the second node N2.

The second pull-up transistor PU2 may be a PMOS transistor that includes a source coupled to the power supply voltage VDD, a drain coupled to the second node N2, and a gate coupled to the first node N1. The second pull-down transistor PD2 may be an NMOS transistor that includes a drain coupled to the second node N2, a source coupled to the ground voltage VSS, and a gate coupled to the first node N1.

The first node N1 may be coupled to the second transistor M2 in FIG. 2 and the second node N2 may be coupled to the first transistor M1 in FIG. 2.

Figure 4:
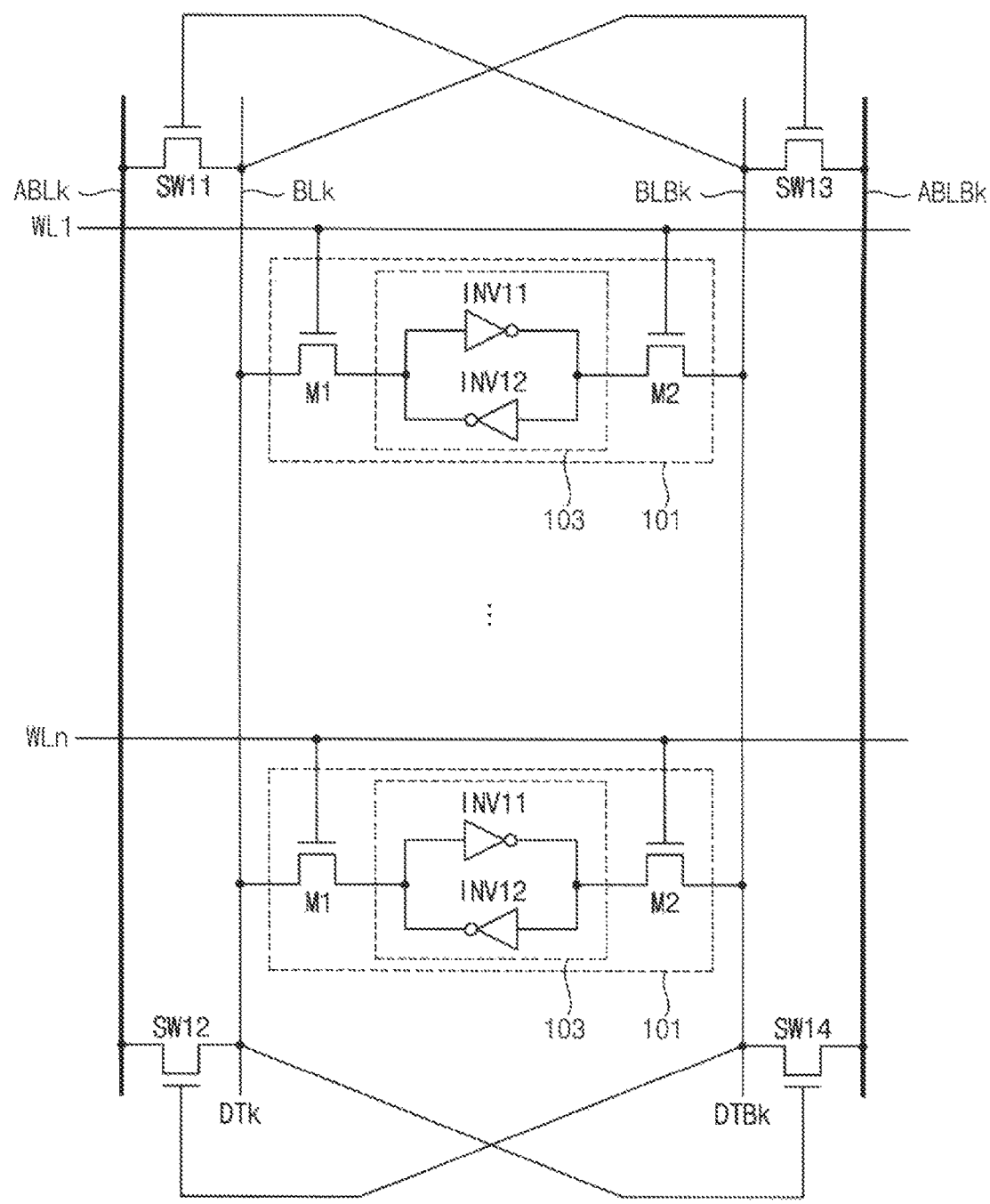
FIG. 4 is a circuit diagram illustrating a memory cell array included in the memory device of FIG. 1 according to an exemplary embodiment of the inventive concept.

FIG. 4 is a circuit diagram illustrating a memory cell array included in the memory device of FIG. 1 according to an exemplary embodiment of the inventive concept.

Referring to FIG. 4, each of the first through m-th columns of the memory cell array 100 may include the first switch SW11, the second switch SW12, the third switch SW13, and the fourth switch SW14.

The memory cell array of FIG. 4 differs from the memory cell array of FIG. 2 in that the memory cell array of FIG. 4 does not include the first through fourth inverters 121, 122, 123, and 124, the gate of the first switch SW11 is coupled to the first end of the k-th complementary bit line BLBk, the gate of the second switch SW12 is coupled to the second end of the k-th complementary bit line BLBk, the gate of the third switch SW13 is coupled to the first end of the k-th bit line BLk, and the gate of the fourth switch SW14 is coupled to the second end of the k-th bit line BLk.

Therefore, when the k-th data bit DTk has a low level, the k-th bit line BLk is electrically disconnected from the k-th auxiliary complementary bit line ABLBk, the k-th complementary bit line BLBk is electrically connected to the k-th auxiliary bit line ABLk, and the write performance of the memory device 10 may be enhanced. In addition, when the k-th data bit DTk has a high level, the k-th bit line BLk is electrically connected to the k-th auxiliary complementary bit line ABLBk, the k-th complementary bit line BLBk is electrically disconnected from the k-th auxiliary bit line ABLk, and the write performance of the memory device 10 may be enhanced.

Figure 5:
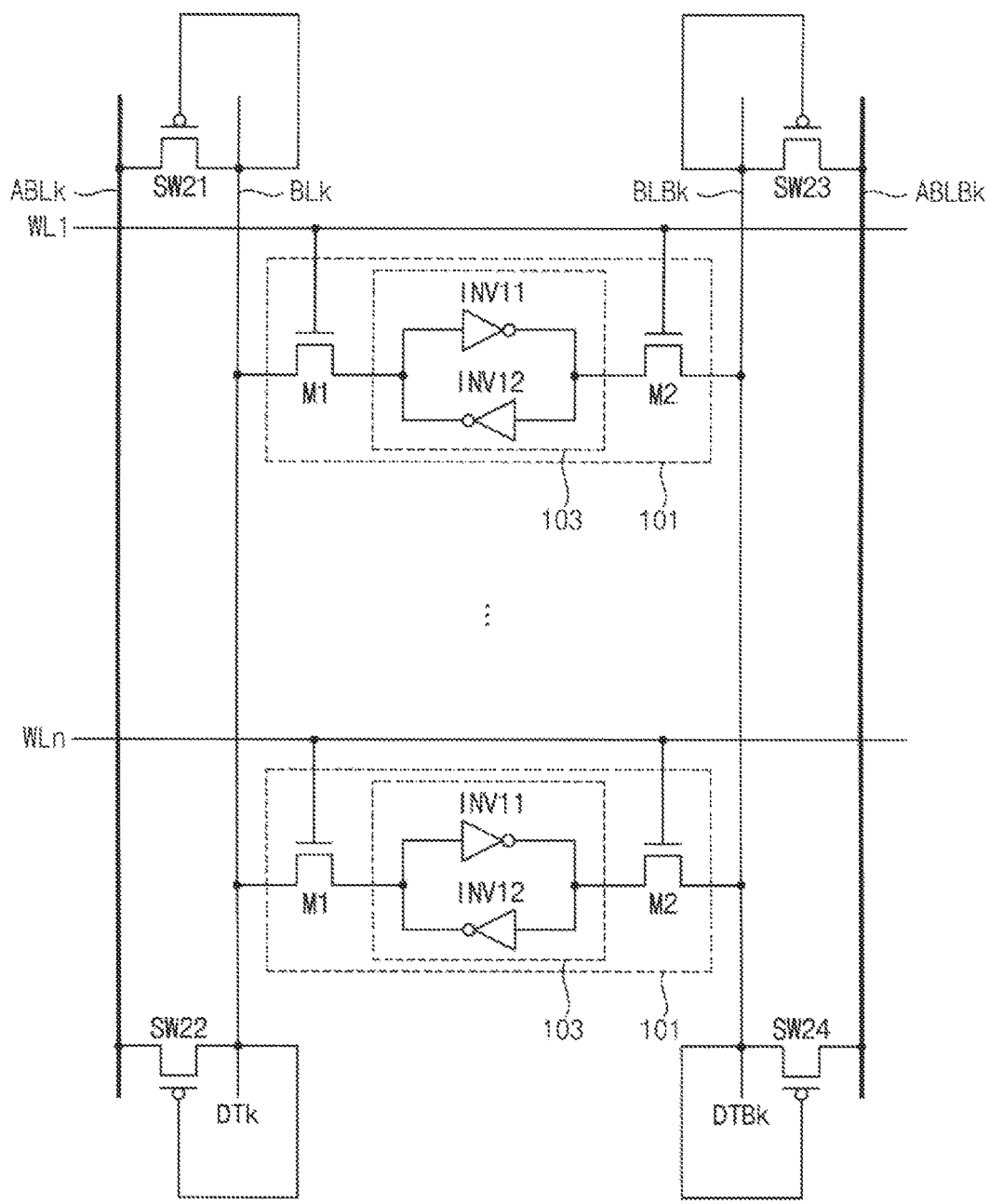
FIG. 5 is a circuit diagram illustrating a memory cell array included in the memory device of FIG. 1 according to an exemplary embodiment of the inventive concept.

FIG. 5 is a circuit diagram illustrating a memory cell array included in the memory device of FIG. 1 according to an exemplary embodiment of the inventive concept.

Referring to FIG. 5, each of the first through m-th columns of the memory cell array 100 may include a first switch SW21, a second switch SW22, a third switch SW23, and a fourth switch SW24. Each of the first switch SW21, the second switch SW22, the third switch SW23, and the fourth switch SW24 may be a PMOS transistor.

The memory cell array of FIG. 5 differs from the memory cell array of FIG. 2 in that the memory cell array of FIG. 4 does not include the first through fourth inverters 121, 122, 123, and 124, and each of the first switch SW21, the second switch SW22, the third switch SW23, and the fourth switch SW24 is implemented with a PMOS transistor.

Therefore, when the k-th data bit DTk has a low level, the k-th bit line BLk is electrically disconnected from the k-th auxiliary bit line ABLk, the k-th complementary bit line BLBk is electrically connected to the k-th auxiliary complementary bit line ABLBk, and the write performance of the memory device 10 may be enhanced. In addition, when the k-th data bit DTk has a high level, the k-th bit line BLk is electrically connected to the k-th auxiliary bit line ABLk, the k-th complementary bit line BLBk is electrically disconnected from the k-th auxiliary complementary bit line ABLBk, and the write performance of the memory device 10 may be enhanced.

Figure 6:
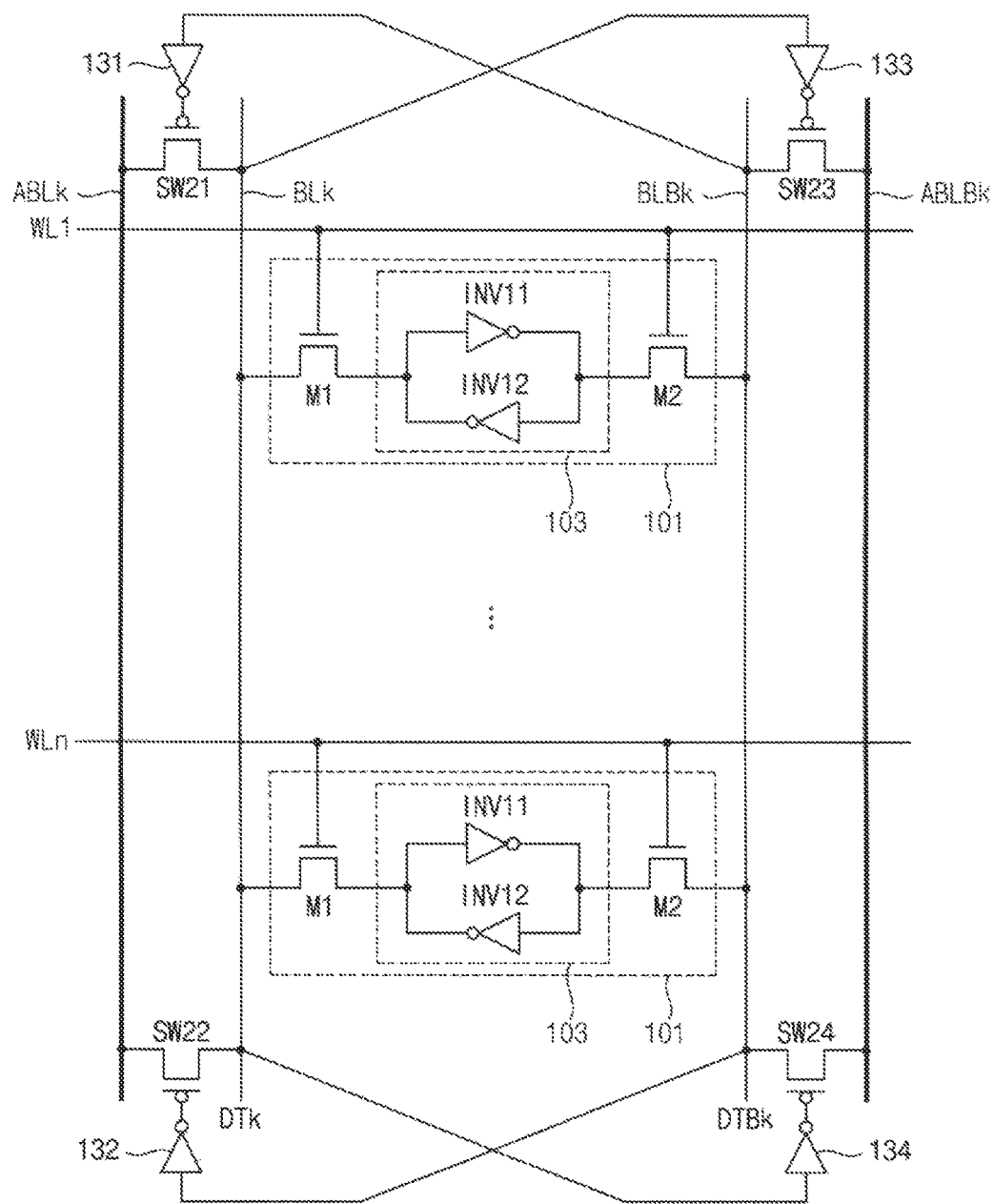
FIG. 6 is a circuit diagram illustrating a memory cell array included in the memory device of FIG. 1 according to an exemplary embodiment of the inventive concept.

FIG. 6 is a circuit diagram illustrating a memory cell array included in the memory device of FIG. 1 according to an exemplary embodiment of the inventive concept.

Referring to FIG. 6, each of the first through m-th columns of the memory cell array 100 may include the first switch SW21, the second switch SW22, the third switch SW23, the fourth switch SW24, a first inverter 131, a second inverter 132, a third inverter 133, and a fourth inverter 134.

Each of the first switch SW21, the second switch SW22, the third switch SW23, and the fourth switch SW24 may be a PMOS transistor.

The memory cell array of FIG. 6 differs from the memory cell array of FIG. 2 in that the gate of the first switch SW21 is coupled to the first end of the k-th complementary bit line BLBk through the first inverter 131, the gate of the second switch SW22 is coupled to the second end of the k-th complementary bit line BLBk through the second inverter 132, the gate of the third switch SW13 is coupled to the first end of the k-th bit line BLk through the third inverter 133, and the gate of the fourth switch SW14 is coupled to the second end of the k-th bit line BLk through the fourth inverter 134.

Therefore, when the k-th data bit DTk has a low level, the k-th bit line BLk is electrically connected to the k-th auxiliary bit line ABLk, the k-th complementary bit line BLBk is electrically disconnected from the k-th auxiliary complementary bit line ABLBk, and the write performance of the memory device 10 may be enhanced. In addition, when the k-th data bit DTk has a high level, the k-th bit line BLk is electrically disconnected from the k-th auxiliary bit line ABLk, the k-th complementary bit line BLBk is electrically connected to the k-th auxiliary complementary bit line ABLBk, and the write performance of the memory device 10 may be enhanced.

Figure 7:
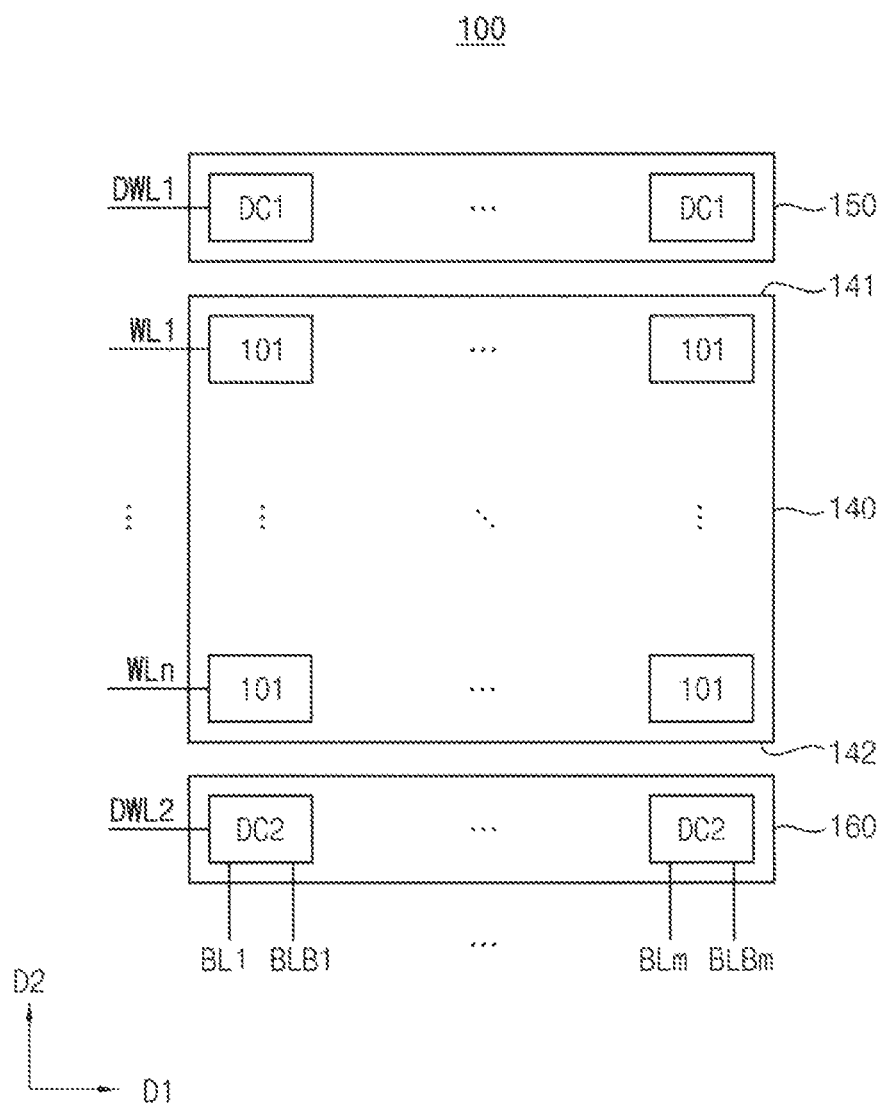
FIG. 7 illustrates the memory cell array in the memory device of FIG. 1 according to an exemplary embodiment of the inventive concept.

FIG. 7 illustrates the memory cell array in the memory device of FIG. 1 according to an exemplary embodiment of the inventive concept.

Referring to FIG. 7, the memory cell array 100 includes a data cell region 140, a first dummy cell region 150, and a second dummy cell region 160. The memory cells 101 are arranged in the data cell region 140. The first dummy cell region 150 is adjacent to a first edge 141 of the data cell region 140 in a second direction D2. The second dummy cell region 160 is adjacent to a second edge 142 of the data cell region 140 in the second direction D2. The first dummy cell region 150 includes a plurality of first dummy cells DC1 coupled to a first dummy word line DWL1 which extends in a first direction D1 crossing the second direction D2. The second dummy cell region 160 includes a plurality of second dummy cells DC2 coupled to a second dummy word line DWL2 which extends in the first direction D1.

The word lines WL1~WLn extend in the first direction D1 and the bit lines BL1~BLm and the complementary bit lines BLB1~BLBm extend in the second direction D2.

Figure 8:
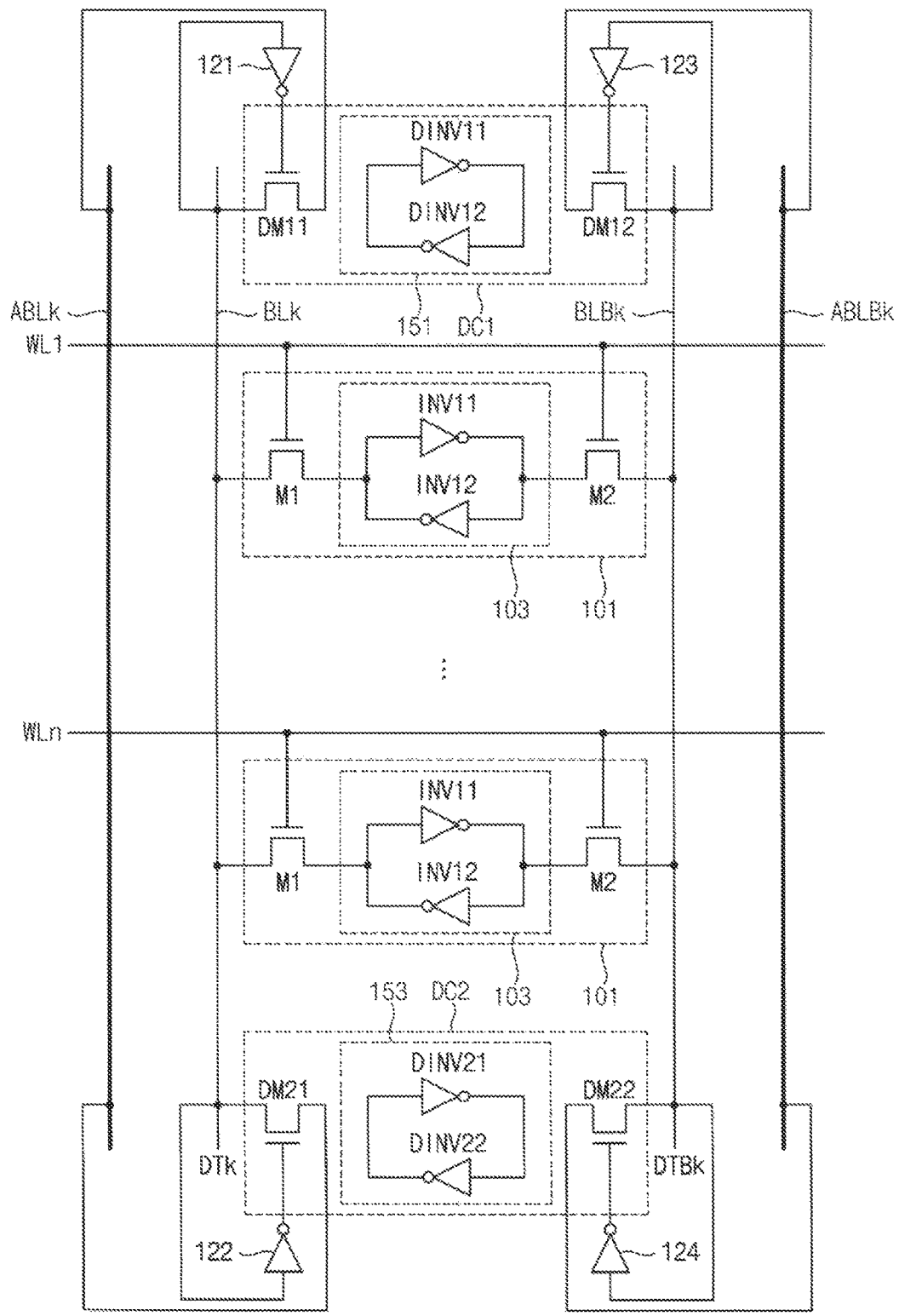
FIG. 8 is a circuit diagram illustrating the memory cell array of FIG. 7 according to an exemplary embodiment of the inventive concept.

FIG. 8 is a circuit diagram illustrating the memory cell array of FIG. 7 according to an exemplary embodiment of the inventive concept.

For ease of explanation, memory cells and associated components included in the k-th column among first through m-th columns in the memory cell array 100 are illustrated in FIG. 8. A configuration of the data cell region 140 is already explained above with reference to FIG. 2.

Referring to FIGS. 7 and 8, similar to the memory cell 101, the first dummy cell DC1 includes a first transistor DM11, a second transistor DM12, and a data storage circuit 151. The data storage circuit 151 may include a first inverter DINV11 and a second inverter DINV12. The second dummy cell DC2 includes a first transistor DM21, a second transistor DM22, and a data storage circuit 153. The data storage circuit 153 may include a first inverter DINV21 and a second inverter DINV22.

Each of the inverters DINV11, DINV12, DINV21, and DINV22 may include a pull-up transistor and a pull-down transistor as described above with reference to FIG. 3.

The first transistor DM11 has a first electrode coupled to the first end of the k-th bit line BLk, a second electrode coupled to a first end of the k-th auxiliary bit line ABLk, and a gate coupled to the first end of the k-th bit line BLk through the first inverter 121. The first transistor DM21 has a first electrode coupled to the second end of the k-th bit line BLk, a second electrode coupled to a second end of the k-th auxiliary bit line ABLk, and a gate coupled to the second end of the k-th bit line BLk through the second inverter 122.

The second transistor DM12 has a first electrode coupled to the first end of the k-th complementary bit line BLBk, a second electrode coupled to a first end of the k-th auxiliary complementary bit line ABLBk, and a gate coupled to the first end of the k-th complementary bit line BLBk through the third inverter 123. The second transistor DM22 has a first electrode coupled to the second end of the k-th complementary bit line BLBk, a second electrode coupled to a second end of the k-th auxiliary complementary bit line ABLBk, and a gate coupled to the second end of the k-th complementary bit line BLBk through the fourth inverter 124.

In the memory cell array of FIG. 8, the first transistor DM11 and the second transistor DM12 in the first dummy cell DC1 are respectively used as the first switch and the third switch which are described with reference to FIGS. 2 and 4, and the first transistor DM21 and the second transistor DM22 in the second dummy cell DC2 are respectively used as the third switch and the fourth switch. Therefore, the memory device 10 including the memory cell array of FIG. 8 may perform a write assist operation without increasing occupied area.

In addition, the pull-up transistors of the inverters DINV11, DINV12, DINV21, and DINV22 may be used as the first through fourth switches which are described with reference to FIGS. 5 and 6, and thus the write assist operation may be performed without increasing occupied area.

Figure 9:
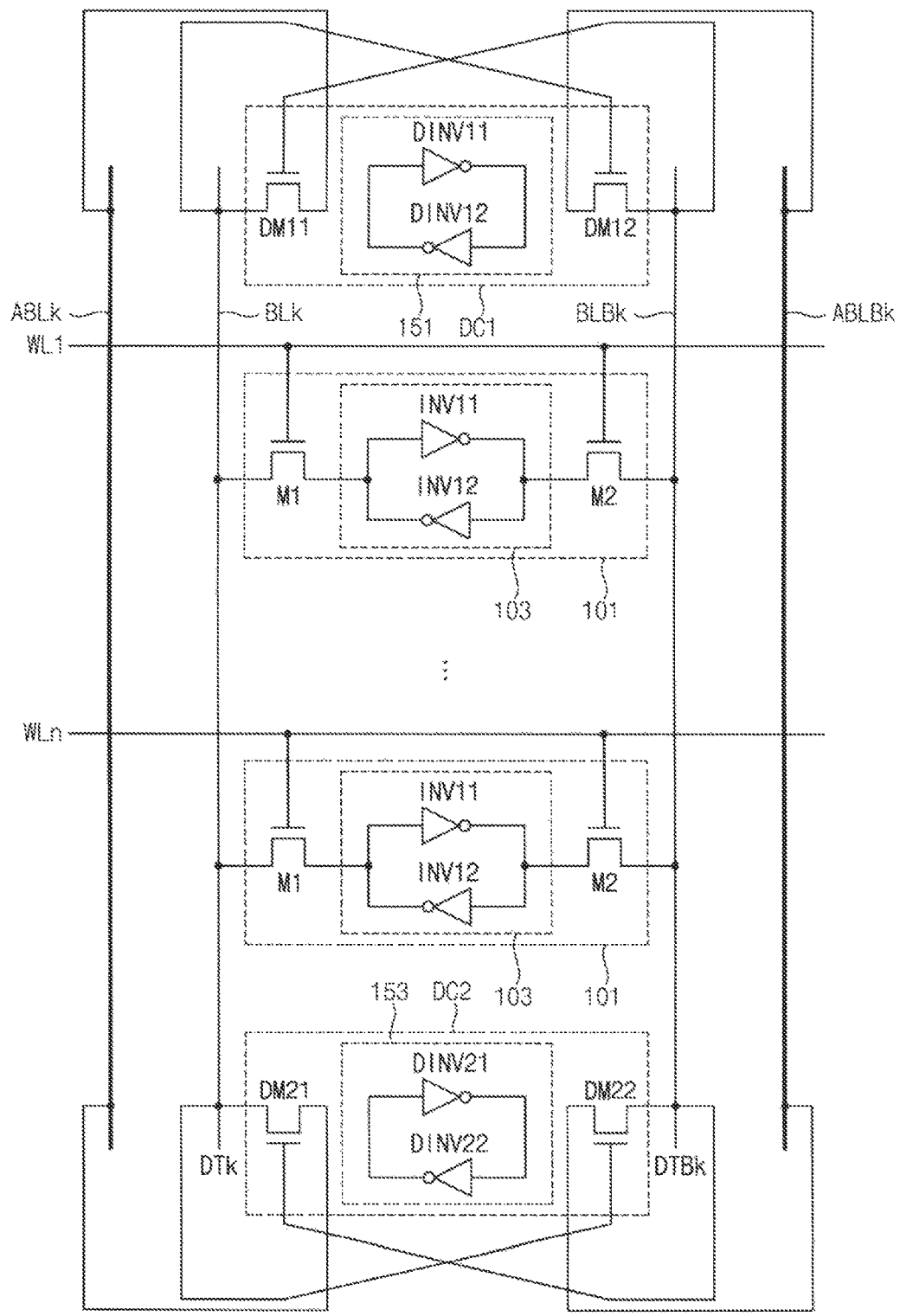
FIG. 9 is a circuit diagram illustrating the memory cell array of FIG. 7 according to an exemplary embodiment of the inventive concept.

FIG. 9 is a circuit diagram illustrating the memory cell array of FIG. 7 according to an exemplary embodiment of the inventive concept.

The memory cell array of FIG. 9 differs from the memory cell array of FIG. 8 in that the memory cell array of FIG. 9 does not include the first through fourth inverters 121, 122, 123, and 124, the gate of the first transistor DM11 is coupled to the first end of the k-th complementary bit line BLBk, the gate of the first transistor DM21 is coupled to the second end of the k-th complementary bit line BLBk, the gate of the second transistor DM12 is coupled to the first end of the k-th bit line BLk, and the gate of the second transistor DM22 is coupled to the second end of the k-th bit line BLk.

Figure 10:
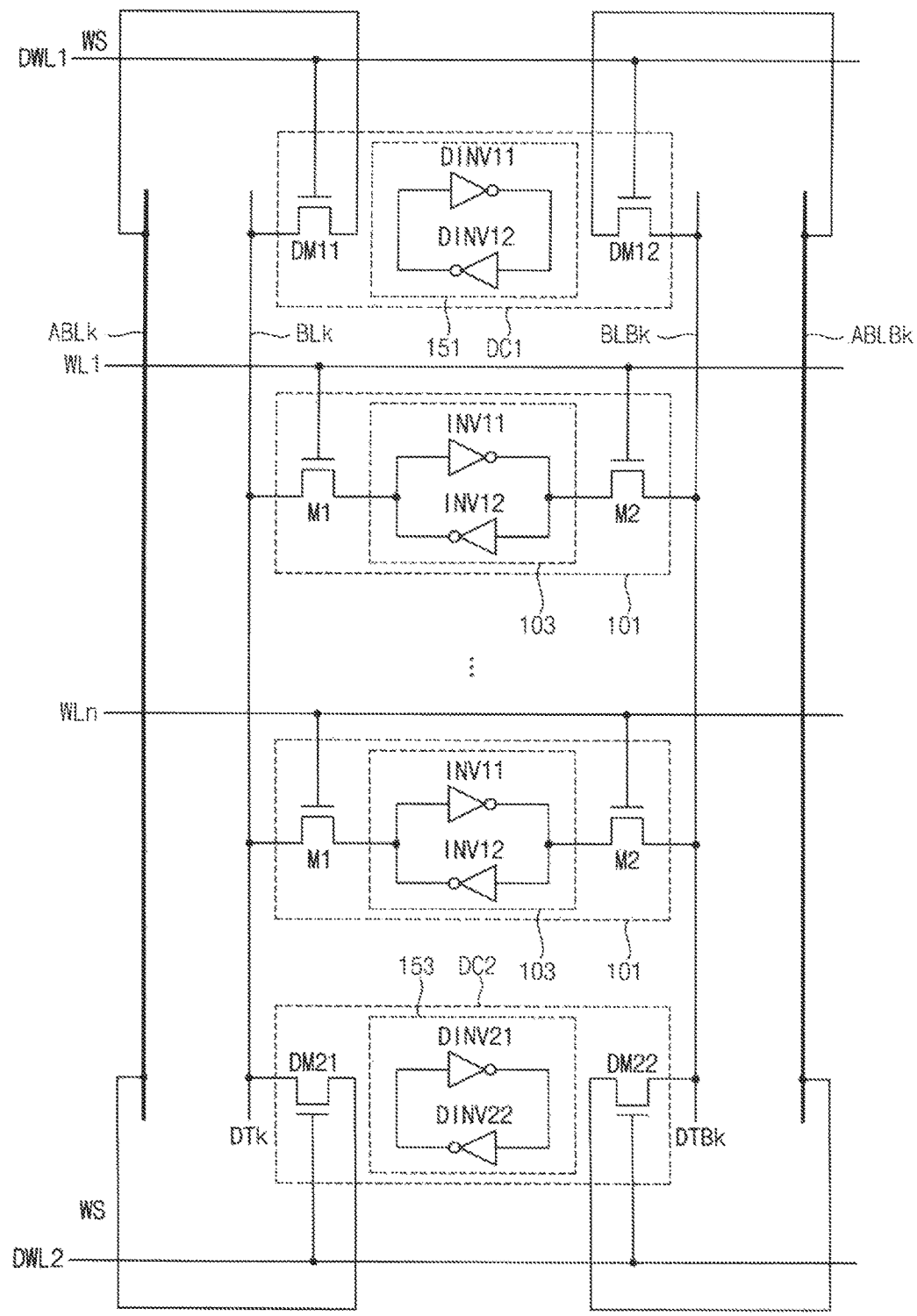
FIG. 10 is a circuit diagram illustrating the memory cell array of FIG. 7 according to an exemplary embodiment of the inventive concept.

FIG. 10 is a circuit diagram illustrating the memory cell array of FIG. 7 according to an exemplary embodiment of the inventive concept.

The memory cell array of FIG. 10 differs from the memory cell array of FIG. 8 in that the memory cell array of FIG. 10 does not include the first through fourth inverters 121, 122, 123, and 124, a write signal WS is applied to the gates of the first transistors DM11 and DM12 through the first dummy word line DWL1 coupled to the gates of the first transistors DM11 and DM12, and the write signal WS is applied to the gates of the second transistors DM21 and DM22 through the second dummy word line DWL2 coupled to the gates of the second transistors DM21 and DM22. In addition, the memory cell array of FIG. 10 differs from the memory cell array of FIG. 8 in that the k-th bit line BLk is coupled to the k-th auxiliary bit line ABLk and the k-th complementary bit line BLBk is coupled to the k-th auxiliary complementary bit line ABLBk using the write signal WS.

Figure 11:
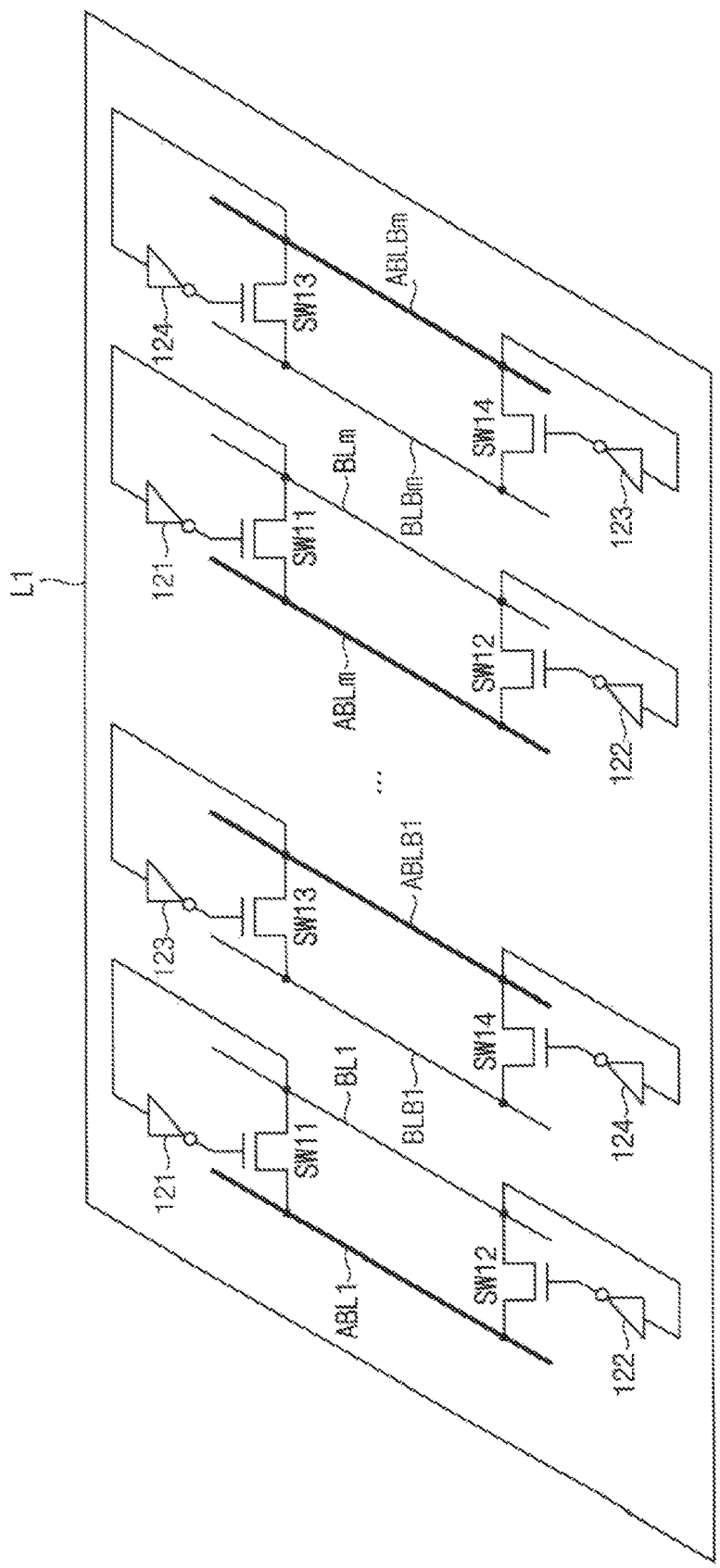
FIG. 11 is a diagram illustrating an arrangement of a plurality of bit lines, a plurality of complementary bit lines, a plurality of auxiliary bit lines, and a plurality of auxiliary complementary bit lines included in the memory device of FIG. 1 according to an exemplary embodiment of the inventive concept.

FIG. 11 is a diagram illustrating an arrangement of a plurality of bit lines, a plurality of complementary bit lines, a plurality of auxiliary bit lines, and a plurality of auxiliary complementary bit lines included in the memory device of FIG. 1 according to an exemplary embodiment of the inventive concept.

As illustrated in FIG. 11, the first through m-th bit lines BL1~BLm, the first through m-th complementary bit lines BLB1~BLBm, the first through m-th auxiliary bit lines ABL1~ABLm, and the first through m-th auxiliary complementary bit lines ABLB1~ABLBm may be formed on a same first layer L1.

In this case, during the write operation, one of a corresponding one of the first through m-th bit lines BL1~BLm and a corresponding one of the first through m-th complementary bit lines BLB1~BLBm is electrically connected to one of a corresponding one of the first through m-th auxiliary bit lines ABL1~ABLm and a corresponding one of the first through m-th auxiliary complementary bit lines ABLB1~ABLBm through the switch circuit 180 formed on the first layer L1.

Figure 12:
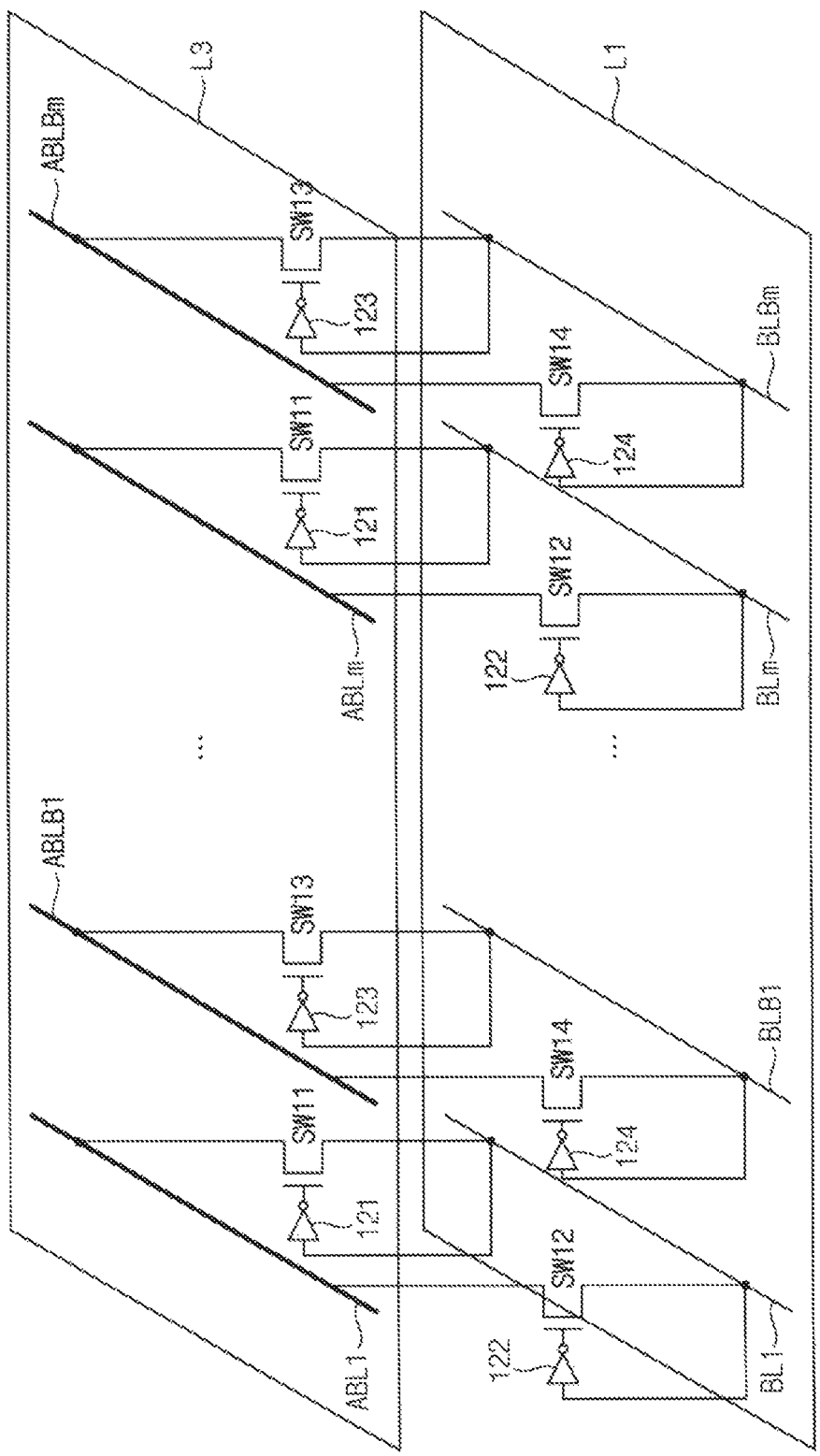
FIG. 12 is a diagram illustrating an arrangement of a plurality of bit lines, a plurality of complementary bit lines, a plurality of auxiliary bit lines, and a plurality of auxiliary complementary bit lines included in the memory device of FIG. 1 according to an exemplary embodiment of the inventive concept.

FIG. 12 is a diagram illustrating an arrangement of a plurality of bit lines, a plurality of complementary bit lines, a plurality of auxiliary bit lines, and a plurality of auxiliary complementary bit lines included in the memory device of FIG. 1 according to an exemplary embodiment of the inventive concept.

As illustrated in FIG. 12, the first through m-th bit lines BL1~BLm and the first through m-th complementary bit lines BLB1~BLBm may be formed on the first layer L1, and the first through m-th auxiliary bit lines ABL1~ABLm and the first through m-th auxiliary complementary bit lines ABLB1~ABLBm may be formed on a third layer L3, which is located above the first layer L1. In other words, the third layer L3 may be adjacent to the first layer L1.

In this case, during the write operation, one of a corresponding one of the first through m-th bit lines BL1~BLm and a corresponding one of the first through m-th complementary bit lines BLB1~BLBm is electrically connected to one of a corresponding one of the first through m-th auxiliary bit lines ABL1~ABLm and a corresponding one of the first through m-th auxiliary complementary bit lines ABLB1~ABLBm through the switch circuit 180 formed between the first layer L1 and the third layer L3.

Figure 13:
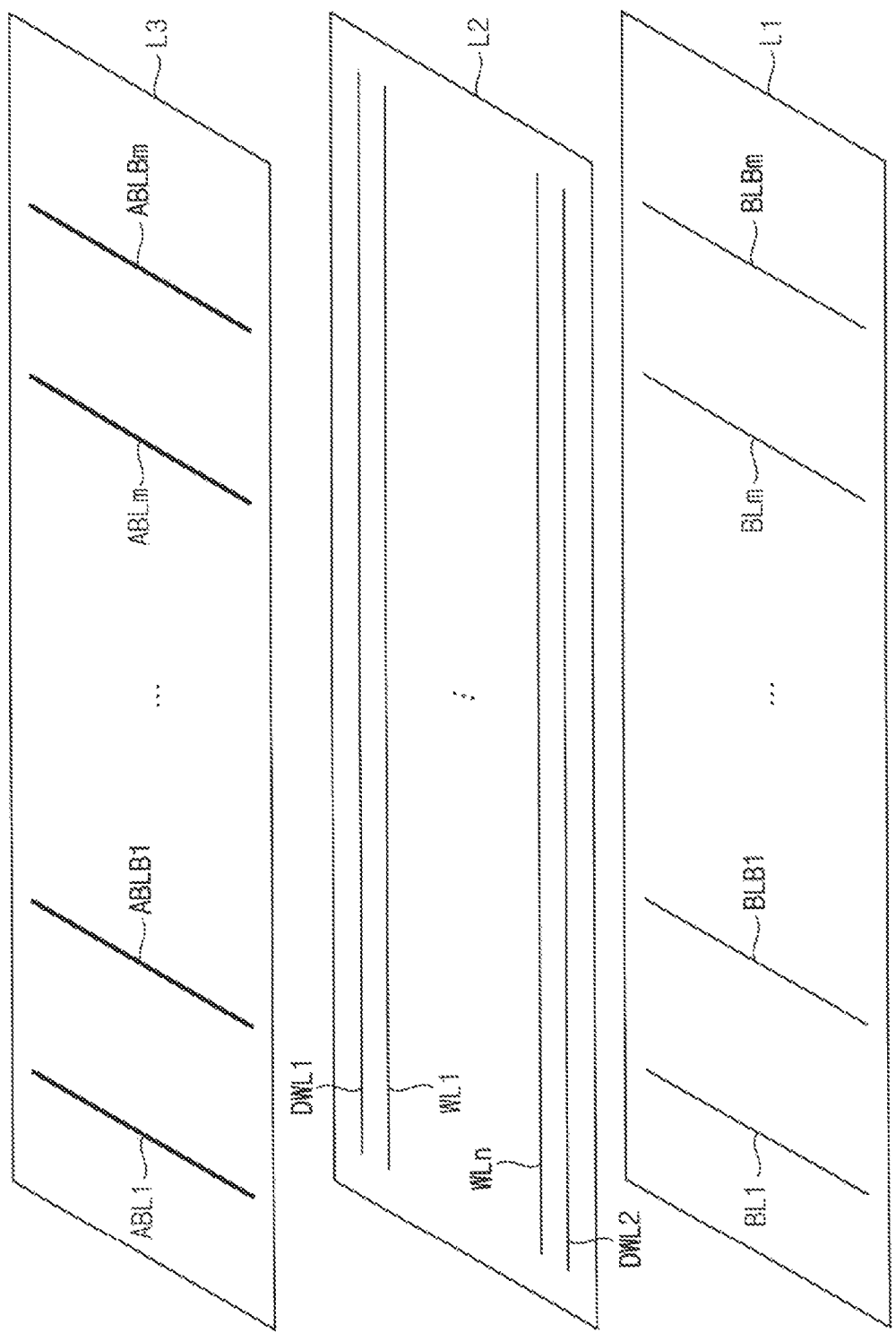
FIG. 13 is a diagram illustrating an arrangement of a plurality of word lines, a plurality of bit lines, a plurality of complementary bit lines, a plurality of auxiliary bit lines, and a plurality of auxiliary complementary bit lines included in the memory device of FIG. 1 according to an exemplary embodiment of the inventive concept.

FIG. 13 is a diagram illustrating an arrangement of a plurality of word lines, a plurality of bit lines, a plurality of complementary bit lines, a plurality of auxiliary bit lines, and a plurality of auxiliary complementary bit lines included in the memory device of FIG. 1 according to an exemplary embodiment of the inventive concept.

The first layer L1 and the third layer L3 of FIG. 13 may be substantially the same as the first layer L1 and the third layer L3 of FIG. 12. For ease of explanation, the switch circuit 180 is omitted in FIG. 13.

Referring to FIG. 13, the first through n-th word lines WL1~WLn (as well as the first and second dummy word lines DWL1 and DWL2) included in the memory device 10 may be formed on a second layer L2, which is located above the first layer L1 and is located below the third layer L3. In other words, the first layer L1 may be adjacent to the second layer L2, the third layer L3 may be adjacent to the second layer L2, and the second layer L2 may be disposed between the first layer L1 and the third layer L3. In this case, the switch circuit 180, which is formed between the first layer L1 and the third layer L3, may be formed not to contact the first through n-th word lines WL1~WLn on the second layer L2.

Figure 14:
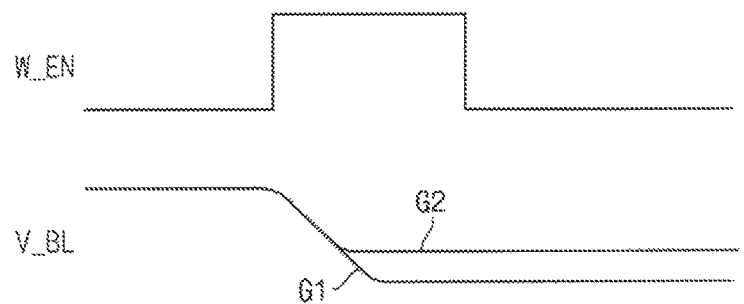
FIG. 14 is a diagram for describing an enhancement of a write performance of the memory device of FIG. 1 according to an exemplary embodiment of the inventive concept.

FIG. 14 is a diagram for describing an enhancement of a write performance of the memory device of FIG. 1 according to an exemplary embodiment of the inventive concept.

During the write operation, the write driver 400 included in the memory device 10 may store one bit data in the data storage circuit 103 of the memory cell 101 through the bit line BLk and the complementary bit line BLBk while the write enable signal W_EN is activated.

FIG. 14 represents a process of writing a bit having a logic low level in the memory cell 101 while the memory cell 101 stores a bit having a logic high level.

When the write driver 400 applies a voltage of a low level to the bit line BLk after the write enable signal W_EN is activated, a voltage V_BL of the bit line BLk may decrease from the logic high level to the logic low level.

When a resistance of the bit line BLk and a resistance of the complementary bit line BLBk are relatively small, the voltage V_BL of the bit line BLk may rapidly decrease from the logic high level to the logic low level as shown in a first graph G1.

On the other hand, when the resistance of the bit line BLk and the resistance of the complementary bit line BLBk are relatively large, the voltage V_BL of the bit line BLk may slowly decrease from the logic high level to a level higher than the logic low level as shown in a second graph G2. In this case, the write operation may not be finished before the write enable signal W_EN is deactivated such that a write capability is reduced.

As described above, in the memory device 10 according to exemplary embodiments of the inventive concept, during the write operation, the memory device 10 may reduce an effective resistance of a bit line between the write driver 400 and the memory cell 101 by connecting one of a corresponding one of the first through m-th bit lines BL1~BLm and a corresponding one of the first through m-th complementary bit lines BLB1~BLBm to one of a corresponding one of the first through m-th auxiliary bit lines ABL1~ABLm and a corresponding one of the first through m-th auxiliary complementary bit lines ABLB1~ABLBm. Therefore, the memory device 10 may enhance the write performance efficiently without increasing the occupied area.

Figure 15:
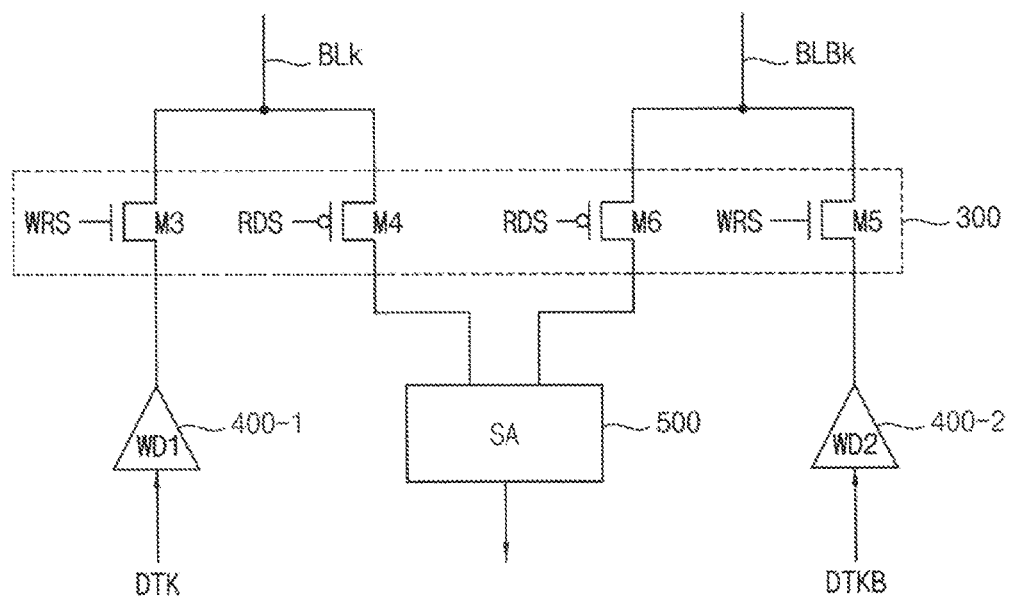
FIG. 15 is a block diagram illustrating a multiplexer circuit included in the memory device of FIG. 1 according to an exemplary embodiment of the inventive concept.

FIG. 15 is a block diagram illustrating a multiplexer circuit included in the memory device of FIG. 1 according to an exemplary embodiment of the inventive concept.

Referring to FIG. 15, the multiplexer circuit 300 may include a third transistor M3 coupled between the bit line BLk and a first write driver 400-1, a fourth transistor M4 coupled between the bit line BLk and the sense amplifier 500, a fifth transistor M5 coupled between the complementary bit line BLBk and a second write driver 400-2, and a sixth transistor M6 coupled between the complementary bit line BLBk and the sense amplifier 500.

In exemplary embodiments of the inventive concept, the third transistor M3 and the fifth transistor M5 may correspond to an NMOS transistor, and the fourth transistor M4 and the sixth transistor M6 may correspond to a PMOS transistor. The multiplexer circuit 300 may internally generate a write selection signal WRS and a read selection signal RDS based on the column address CA, the write enable signal W_EN, and the read enable signal R_EN received from the controller 210.

For example, when the bit line BLk and the complementary bit line BLBk are selected based on the column address CA, the write selection signal WRS may be activated while the write enable signal W_EN is activated, and the read selection signal RDS may be activated while the read enable signal R_EN is activated.

Therefore, when the bit line BLk and the complementary bit line BLBk are selected based on the column address CA, the first write driver 400-1 may be coupled to the bit line BLk and the second write driver 400-2 may be coupled to the complementary bit line BLBk to perform the write operation while the write enable signal W_EN is activated.

On the other hand, when the bit line BLk and the complementary bit line BLBk are selected based on the column address CA, the sense amplifier 500 may be coupled to the bit line BLk and the complementary bit line BLBk to perform the read operation while the read enable signal R_EN is activated.

Figure 16:
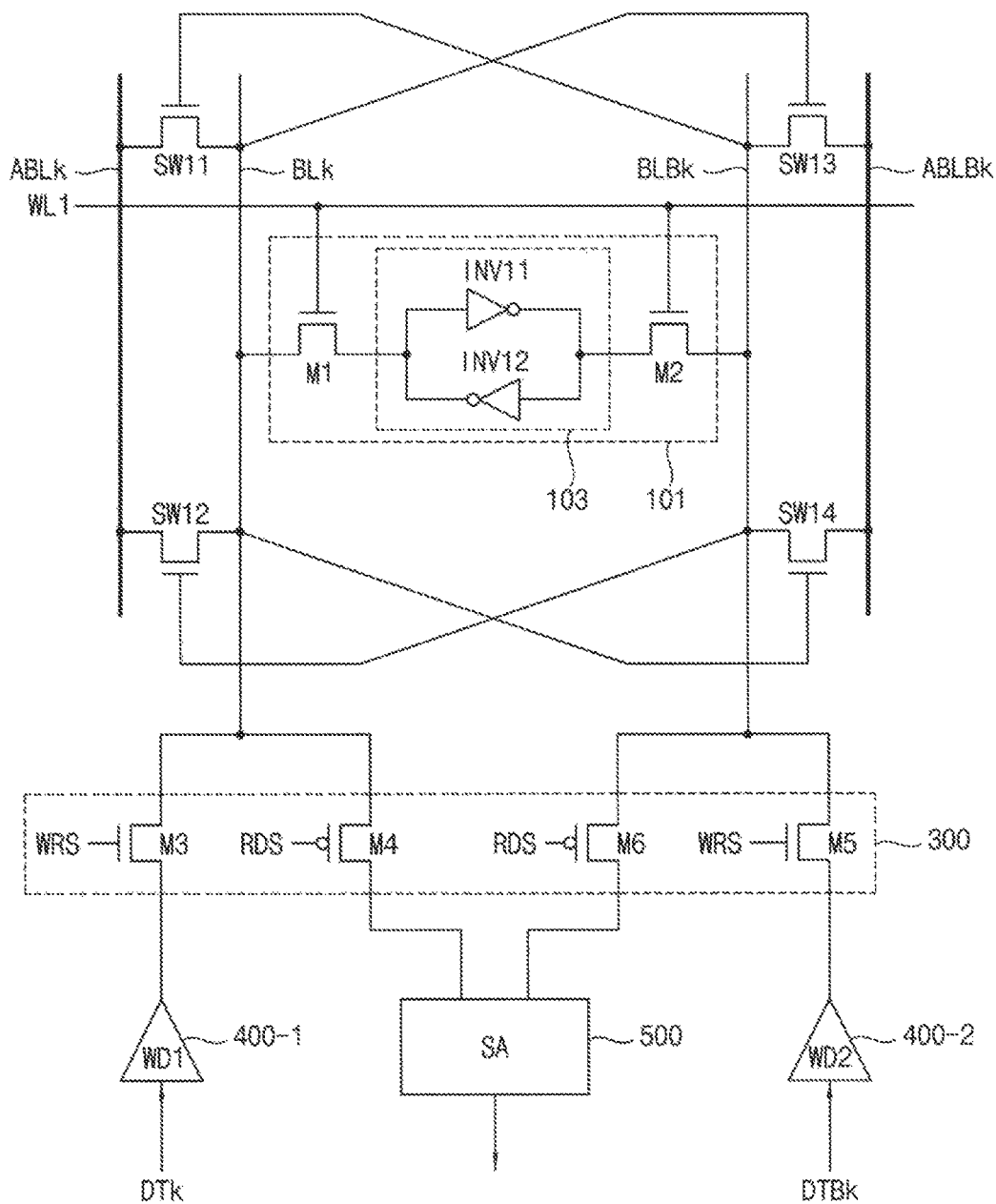
FIG. 16 is a diagram for describing an operation of the memory device of FIG. 1 according to an exemplary embodiment of the inventive concept.

FIG. 16 is a diagram for describing an operation of the memory device of FIG. 1 according to an exemplary embodiment of the inventive concept.

Referring to FIG. 16, during the write operation, the first switch SW11, the second switch SW12, the third switch SW13, and the fourth switch SW14, in response to logic levels of the data bit DTk and the complementary data bit DTBk, may connect one of the bit line BLk and the complementary bit line BLBk to one of the auxiliary bit line ABLk and the auxiliary complementary bit line ABLBk.

In addition, the multiplexer circuit 300 may turn on the third transistor M3 and the fifth transistor M5 such that the first write driver 400-1 may be coupled to the bit line BLk and the second write driver 400-2 may be coupled to the complementary bit line BLBk. Therefore, the first write driver 400-1 and the second write driver 400-2 may store data in the memory cell 101 through the bit line BLk and the complementary bit line BLBk.

During the read operation, when a low level data is stored in the memory cell 101, the third switch SW13 and the fourth switch SW14 are turned off in response to the data bit DTk on the bit line BLk and the complementary bit line BLBk is electrically disconnected from the auxiliary complementary bit line ABLBk. In addition, the first switch SW11 and the second switch SW14 are turned on in response to the complementary data bit DTBk on the complementary bit line BLBk and the bit line BLk is electrically connected to the auxiliary bit line ABLk. Therefore, an effective resistance of the bit line BLk, which transfers the low-level data, may be reduced.

In addition, the multiplexer circuit 300 may turn on the fourth transistor M4 and the sixth transistor M6 such that the sense amplifier 500 may be coupled to the bit line BLk and the complementary bit line BLBk. Therefore, the sense amplifier 500 may read data stored in the memory cell 101 based on a difference between the voltage V_BL of the bit line BLk and a voltage V_BLB of the complementary bit line BLBk.

Since the complementary bit line BLBk is electrically disconnected from the auxiliary complementary bit line ABLBk, an effective parasitic capacitance of the bit line BLk and an effective parasitic capacitance of the complementary bit line BLBk may be reduced. Therefore, a read performance of the memory device 10 may be effectively enhanced.

During the read operation, when a high level data is stored in the memory cell 101, the third switch SW13 and the fourth switch SW14 are turned on in response to the data bit DTk on the bit line BLk and the complementary bit line BLBk is electrically connected to the auxiliary complementary bit line ABLBk. In addition, the first switch SW11 and the second switch SW14 are turned off in response to the complementary data bit DTBk on the complementary bit line BLBk and the bit line BLk is electrically disconnected from the auxiliary bit line ABLk. Therefore, an effective capacitance of the bit line BLk, which transfers the high-level data, may be reduced, and an effective resistance of the complementary bit line BLBk, which transfers the low-level data, may be reduced.

Figure 17:
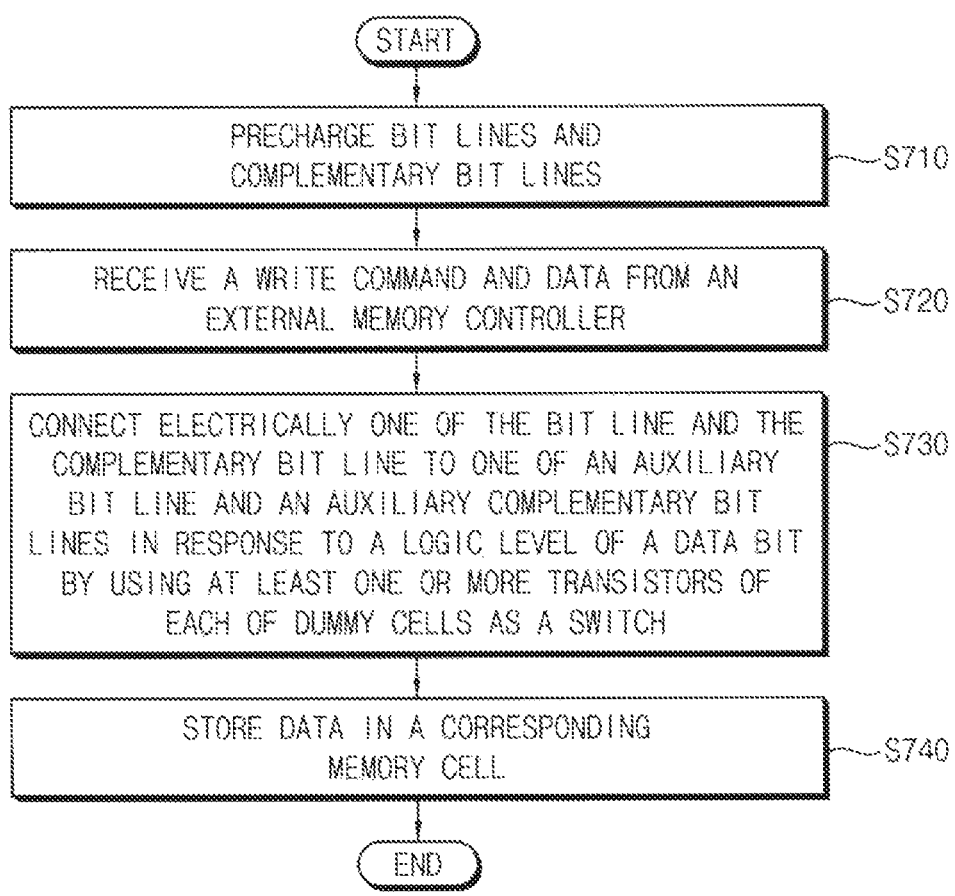
FIG. 17 is a flowchart illustrating a method of operating the memory device of FIG. 1 according to an exemplary embodiment of the inventive concept.

FIG. 17 is a flowchart illustrating a method of operating the memory device of FIG. 1 according to an exemplary embodiment of the inventive concept.

Referring to FIGS. 1 through 17, in a method of operating the memory device 10 which includes the memory cell array 100 including the plurality of memory cells 101, the plurality of bit lines BL1~BLm and the plurality of complementary bit lines BLB1~BLBm are precharged (S710). For example, the plurality of bit lines BL1~BLm and the plurality of complementary bit lines BLB1~BLBm are precharged to a power supply voltage level (a high level), e.g., VDD.

The memory device 10 receives a write command and data from an external memory controller (S720). One of a corresponding one of the bit lines BL1~BLm and a corresponding one of the complementary bit lines BLB1~BLBm is electrically connected to one of a corresponding one of the auxiliary bit lines ABL1~ABLm and a corresponding one of the auxiliary complementary bit lines ABLB1~ABLBm, in response to a logic level of a data bit to be written through each of the bit lines BL1~BLm and each of the complementary bit lines BLB1~BLBm in the memory cells 101 during a write operation, by using at least one or more transistors of each of the dummy cells DC1 and DC2 as a switch (S730). Each of the dummy cells DC1 and DC2 does not store a data bit.

The data is stored in a corresponding memory cell of the plurality of memory cells 101 (S740). One of the corresponding bit line and the corresponding complementary bit line, which transfers a low-level data, is electrically connected to one of the corresponding auxiliary bit line and the corresponding auxiliary complementary bit line, and thus an effective resistance may be reduced. Therefore, the write performance of the memory device 10 may be effectively enhanced.

Figure 18:
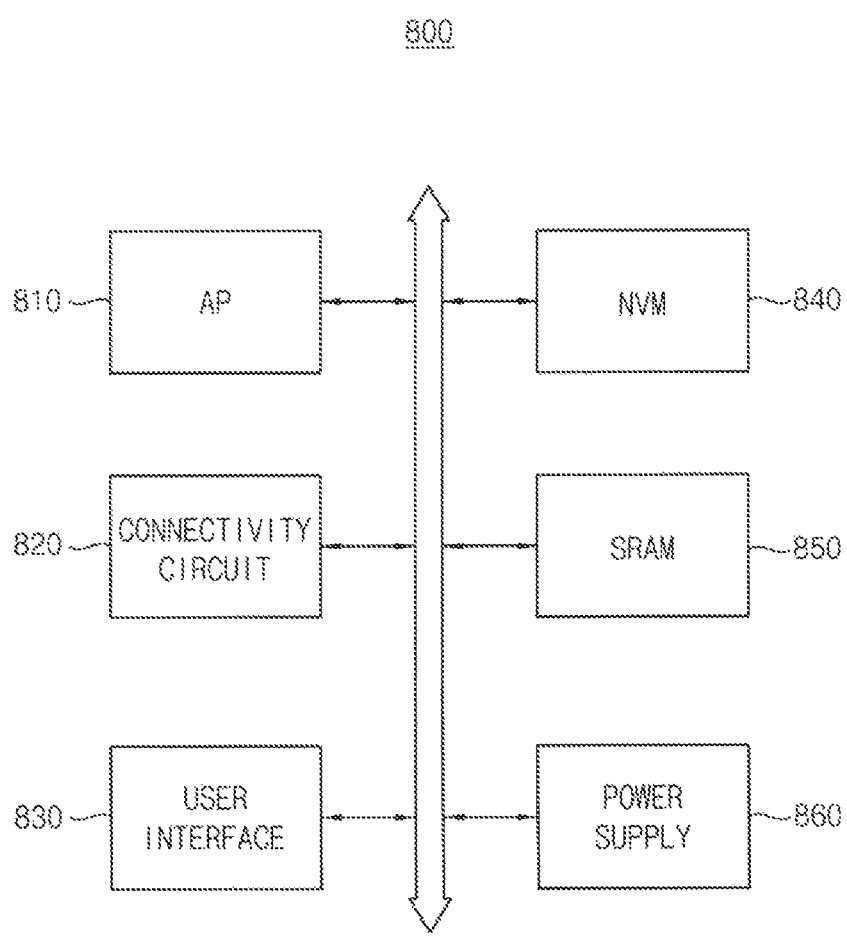
FIG. 18 is a block diagram illustrating a mobile system according to an exemplary embodiment of the inventive concept.

FIG. 18 is a block diagram illustrating a mobile system according to an exemplary embodiment of the inventive concept.

Referring to FIG. 18, a mobile system 800 includes an application processor (AP) 810, a connectivity circuit 820, a user interface 830, a nonvolatile memory device (NVM) 840, a volatile memory device (SRAM) 850, and a power supply 860.

The application processor 810 may execute applications, such as a web browser, a game application, a video player, etc. The connectivity circuit 820 may perform wired or wireless communication with an external device.

The volatile memory device 850 may store data processed by the application processor 810, or may operate as a working memory. The volatile memory device 850 may correspond to the memory device 10 of FIG. 1. Therefore, the volatile memory device 850 may enhance a write performance during a write operation.

The nonvolatile memory device 840 may store a boot image for booting the mobile system 800.

The user interface 830 may include at least one input device, such as a keypad, a touch screen, etc., and at least one output device, such as a speaker, a display device, etc. The power supply 860 may supply a power supply voltage to the mobile system 800.

In exemplary embodiments of the inventive concept, the mobile system 800 may further include an image processor and/or a storage device, such as a memory card, a solid state drive (SSD), etc.

In exemplary embodiments of the inventive concept, the mobile system 800 and/or components of the mobile system 800 may be packaged in various forms.

Accordingly, the memory device according to exemplary embodiments of the inventive concept electrically connects one of a corresponding one of the bit lines and a corresponding one of the complementary bit lines to one of a corresponding one of the auxiliary bit lines and a corresponding one of the auxiliary complementary bit lines, in response to a logic level of a data bit to be written through each of the bit lines and each of the complementary bit lines in the memory cells during a write operation, by using at least one or more transistors of each of dummy cells as a switch. Therefore, an effective resistance of one of the bit line and the complementary bit line, which is electrically connected to one of the auxiliary bit line and the auxiliary complementary bit line, may be reduced, and thus the write performance of the memory device may be enhanced without increasing occupied area.

Although the inventive concept has been shown and described with reference to exemplary embodiments thereof, it will be apparent to those of ordinary skill in the art that many modifications in form and details may be made thereto without materially departing from the spirit and scope of the inventive concept, as set forth by the following claims.

What is claimed is:

1. A memory device, comprising:
a memory cell configured to store a single bit;
a word line connected to the memory cell;
a bit line connected to the memory cell;
a complementary bit line connected to the memory cell;
an auxiliary bit line;
an auxiliary complementary bit line; and
a switch circuit, wherein the switch circuit is configured to electrically connect one of the bit line and the complementary bit line to one of the auxiliary bit line and the auxiliary complementary bit line, in response to a logic level of a data bit to be written in the memory cell during a write operation, by using at least one or more transistors of at least one dummy cell as a switch, and the at least one dummy cell does not store a data bit.

2. The memory device of claim 1, wherein the switch circuit comprises:
a first inverter connected to a first end of the bit line;
a first transistor having a first electrode connected to the first end of the bit line, a second electrode connected to a first end of the auxiliary bit line, and a gate connected to an output of the first inverter;
a second inverter connected to a second end of the bit line;
a second transistor having a first electrode connected to the second end of the bit line, a second electrode connected to a second end of the auxiliary bit line, and a gate connected to an output of the second inverter;
a third inverter connected to a first end of the complementary bit line;
a third transistor having a first electrode connected to the first end of the complementary bit line, a second electrode connected to a first end of the auxiliary complementary bit line, and a gate connected to an output of the third inverter;
a fourth inverter connected to a second end of the complementary bit line; and
a fourth transistor having a first electrode connected to the second end of the complementary bit line, a second electrode connected to a second end of the auxiliary complementary bit line, and a gate connected to an output of the fourth inverter.

3. The memory device of claim 2, wherein:
the first transistor and the second transistor are turned on in response to a logic level of a data bit on the bit line;
the third transistor and the fourth transistor are turned on in response to a logic level of a data bit on the complementary bit line; and
each of the first through fourth transistors is an n-channel metal-oxide semiconductor (NMOS) transistor.

4. The memory device of claim 2, wherein:
the word line extends in a first direction;
the memory device further comprises a first dummy cell region and a second dummy cell region, wherein the memory cell is formed in a data cell region, the first dummy cell region is adjacent to a first edge of the data cell region in a second direction, and the second dummy cell region is adjacent to a second edge of the data cell region in the second direction;
the first dummy cell region includes at least one first dummy cell that does not store a data bit;
the second dummy cell region includes at least one second dummy cell that does not store a data bit;
the first transistor and the third transistor are transistors of the first dummy cell;
the second transistor and the fourth transistor are transistors of the second dummy cell; and
the second direction crosses the first direction.

5. The memory device of claim 1, wherein the switch circuit comprises:
a first transistor having a first electrode connected to a first end of the bit line, a second electrode connected to a first end of the auxiliary bit line, and a gate connected to a first end of the complementary bit line;
a second transistor having a first electrode connected to a second end of the bit line, a second electrode connected to a second end of the auxiliary bit line, and a gate connected to a second end of the complementary bit line;
a third transistor having a first electrode connected to the first end of the complementary bit line, a second electrode connected to a first end of the auxiliary complementary bit line, and a gate connected to the first end of the bit line; and
a fourth transistor having a first electrode connected to the second end of the complementary bit line, a second electrode connected to a second end of the auxiliary complementary bit line, and a gate connected to the second end of the bit line.

6. The memory device of claim 5, wherein:
the first transistor and the second transistor are turned on in response to a logic level of a data bit on the complementary bit line;
the third transistor and the fourth transistor are turned on in response to a logic level of a data bit on the bit line; and
each of the first through fourth transistors is an n-channel metal-oxide semiconductor (NMOS) transistor.

7. The memory device of claim 5, wherein:
the word line extends in a first direction;
the memory device further comprises a first dummy cell region and a second dummy cell region, wherein the memory cell is formed in a data cell region, the first dummy cell region is adjacent to a first edge of the data cell region in a second direction, and the second dummy cell region is adjacent to a second edge of the data cell region in the second direction;

the first dummy cell region includes at least one first dummy cell that does not store a data bit;

the second dummy cell region includes at least one second dummy cell that does not store a data bit;

the first transistor and the third transistor are transistors of the first dummy cell;

the second transistor and the fourth transistor are transistors of the second dummy cell; and the second direction crosses the first direction.

8. The memory device of claim 1, wherein the switch circuit comprises:

a first transistor having a first electrode connected to a first end of the bit line, a second electrode connected to a first end of the auxiliary bit line, and a gate connected to the first end of the bit line;

a second transistor having a first electrode connected to a second end of the bit line, a second electrode connected to a second end of the auxiliary bit line, and a gate connected to the second end of the bit line;

a third transistor having a first electrode connected to a first end of the complementary bit line, a second electrode connected to a first end of the auxiliary complementary bit line, and a gate connected to the first end of the complementary bit line; and a fourth transistor having a first electrode connected to a second end of the complementary bit line, a second electrode connected to a second end of the auxiliary complementary bit line, and a gate connected to the second end of the complementary bit line.

9. The memory device of claim 8, wherein each of the first through fourth transistors is a p-channel metal-oxide semiconductor (PMOS) transistor.

10. The memory device of claim 1, wherein the switch circuit comprises:

a first inverter connected to a first end of the complementary bit line;

a first transistor having a first electrode connected to a first end of the bit line, a second electrode connected to a first end of the auxiliary bit line, and a gate connected to an output of the first inverter;

a second inverter connected to a second end of the complementary bit line;

a second transistor having a first electrode connected to a second end of the bit line, a second electrode connected to a second end of the auxiliary bit line, and a gate connected to an output of the second inverter;

a third inverter connected to the first end of the bit line;

a third transistor having a first electrode connected to the first end of the complementary bit line, a second electrode connected to a first end of the auxiliary complementary bit line, and a gate connected to an output of the third inverter;

a fourth inverter connected to the second end of the bit line; and a fourth transistor having a first electrode connected to the second end of the complementary bit line, a second electrode connected to a second end of the auxiliary complementary bit line, and a gate connected to an output of the fourth inverter.

11. The memory device of claim 10, wherein each of the first through fourth transistors is a p-channel metal-oxide semiconductor (PMOS) transistor.

12. The memory device of claim 1, wherein:

the word line extends in a first direction;

the memory device further comprises a first dummy cell region and a second dummy cell region, wherein the memory cell is formed in a data cell region, the first dummy cell region is adjacent to a first edge of the data cell region in a second direction, and the second dummy cell region is adjacent to a second edge of the data cell region in the second direction;

the first dummy cell region includes at least one first dummy cell that does not store a data bit and is connected to a first dummy word line; and the second dummy cell region includes at least one second dummy cell that does not store a data bit and is connected to a second dummy word line.

13. The memory device of claim 12, wherein the switch circuit comprises:

a first transistor having a first electrode connected to a first end of the bit line, a second electrode connected to a first end of the auxiliary bit line, and a gate connected to the first dummy word line;

a second transistor having a first electrode connected to a second end of the bit line, a second electrode connected to a second end of the auxiliary bit line, and a gate connected to the second dummy word line;

a third transistor having a first electrode connected to a first end of the complementary bit line, a second electrode connected to a first end of the auxiliary complementary bit line, and a gate connected to the first dummy word line; and a fourth transistor having a first electrode connected to a second end of the complementary bit line, a second electrode connected to a second end of the auxiliary complementary bit line, and a gate connected to the second dummy word line, wherein:

the first transistor and the third transistor are transistors of the first dummy cell;

the second transistor and the fourth transistor are transistors of the second dummy cell; and the first through fourth transistors are turned on in response to a write signal applied to the first dummy word line and the second dummy word line.

14. The memory device of claim 1, wherein the bit line and the complementary bit line are disposed on a first layer, the word line is disposed on a second layer, and the auxiliary bit line and the auxiliary complementary bit line are disposed on a third layer, and the first layer is adjacent to the second layer, the third layer is adjacent to the second layer, and the second layer is disposed between the first layer and the third layer.

15. A memory device comprising:

a memory cell array including a plurality of memory cells connected to a plurality of word lines, a plurality of bit lines, and a plurality of complementary bit lines, wherein the plurality of word lines extend in a first direction, the plurality of bit lines extend in a second direction crossing the first direction, and the plurality of complementary bit lines extend in the second direction;

a plurality of auxiliary bit lines extending in the second direction;

a plurality of auxiliary complementary bit lines extending in the second direction; and a switch circuit, wherein the switch circuit electrically connects one of a corresponding one of the bit lines and a corresponding one of the complementary bit lines to one of a corresponding one of the auxiliary bit lines and a corresponding one of the auxiliary complementary bit lines, in response to a logic level of a data bit to be written through each of the bit lines and each of the complementary bit lines in the memory cells during a write operation, by using at least one or more transistors of each of dummy cells as a switch, and each of the dummy cells does not store a data bit.

16. The memory device of claim 15, wherein:
the memory cell array includes a first dummy cell region and a second dummy cell region, wherein the memory cells are formed in a data cell region, the first dummy cell region is adjacent to a first edge of the data cell region in the second direction, and the second dummy cell region is adjacent to a second edge of the data cell region in the second direction;
the first dummy cell region includes a plurality of first dummy cells that do not store data; and
the second dummy cell region includes a plurality of second dummy cells that do not store data.

17. The memory device of claim 16, wherein each of the memory cells comprises:
a storage circuit including a latch;
a first transistor connected between a corresponding bit line and a first terminal of the storage circuit; and
a second transistor connected between a corresponding complementary bit line and a second terminal of the storage circuit.

18. The memory device of claim 16, wherein:
the first dummy cells include first transistors having substantially the same configuration as that of first transistors of the memory cells;
the first dummy cells include second transistors having substantially the same configuration as that of second transistors of the memory cells;
wherein the switch circuit electrically connects one of the corresponding one the bit lines and the corresponding one of the complementary bit lines to one of the corresponding one of the auxiliary bit lines and the corresponding one of the auxiliary complementary bit lines by using a portion of the first transistors and a portion of the second transistors as switches.

19. The memory device of claim 15, wherein the plurality of bit lines and the plurality of complementary bit lines are disposed on a first layer, the plurality of word lines are disposed on a second layer, and the plurality of auxiliary bit lines and the plurality of auxiliary complementary bit lines are disposed on a third layer, and
    the first layer is adjacent to the second layer,
    the third layer is adjacent to the second layer, and
    the second layer is disposed between the first layer and the third layer.

20. A method of operating a memory device, wherein the memory device includes a memory cell array including a plurality of memory cells connected to a plurality of word lines, a plurality of bit lines, and a plurality of complementary bit lines, and wherein the plurality of word lines extend in a first direction, the plurality of bit lines extend in a second direction crossing the first direction, and the plurality of complementary bit lines extend in the second direction, the method comprising:
precharging the plurality of bit lines and the plurality of complementary bit lines;
receiving a write command and data from an external memory controller;
electrically connecting one of a corresponding one of the plurality of bit lines and a corresponding one of the plurality of complementary bit lines to one of a corresponding one of the plurality of auxiliary bit lines and a corresponding one of the plurality of auxiliary complementary bit lines, in response to a logic level of a data bit to be written through each of the plurality of bit lines and each of the plurality of complementary bit lines in the plurality of memory cells during a write operation, by using at least one or more transistors of each of dummy cells as a switch, wherein each of the dummy cells does not store a data bit; and
storing the data in a corresponding memory cell of the plurality of memory cells.

* * * * *